United States Patent
Miremadi et al.

(10) Patent No.: US 10,833,438 B1
(45) Date of Patent: Nov. 10, 2020

(54) APPARATUS FOR SURFACE MOUNT CONNECTORS

(71) Applicant: HEWLETT PACKARD ENTERPRISE DEVELOPMENT LP, Houston, TX (US)

(72) Inventors: Jian Miremadi, Palo Alto, CA (US); David A. Moore, Tomball, TX (US); John Norton, Houston, TX (US); Eduardo F. Velazquez, Mayaguez, PR (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/400,540

(22) Filed: May 1, 2019

(51) Int. Cl.
| | |
|---|---|
| *H01R 12/70* | (2011.01) |
| *H05K 1/18* | (2006.01) |
| *H01R 13/11* | (2006.01) |
| *H01R 12/71* | (2011.01) |

(52) U.S. Cl.
CPC ......... *H01R 12/707* (2013.01); *H01R 12/716* (2013.01); *H01R 13/113* (2013.01); *H05K 1/181* (2013.01); *H05K 2201/10189* (2013.01)

(58) Field of Classification Search
CPC .. H01R 12/707; H01R 12/716; H01R 13/113; H05K 2201/10189
USPC ........................................................ 439/55
See application file for complete search history.

(56) References Cited

U.S. PATENT DOCUMENTS

| | | | | |
|---|---|---|---|---|
| 3,721,940 A | * | 3/1973 | Michel ................... | H01R 12/78 439/495 |
| 4,197,945 A | * | 4/1980 | Sherwood ............ | H01R 13/447 174/138 F |
| 4,396,245 A | * | 8/1983 | Lane ..................... | H01R 13/443 29/758 |
| 4,538,865 A | * | 9/1985 | Wakabayashi ......... | H05K 3/365 439/493 |
| 4,795,354 A | * | 1/1989 | Owen .................... | H01R 12/87 439/135 |
| 5,688,133 A | * | 11/1997 | Ikesugi ................ | H01R 43/205 439/135 |
| 6,135,795 A | * | 10/2000 | Ho ....................... | H01R 43/205 439/135 |
| 6,179,642 B1 | * | 1/2001 | Hwang .............. | H01R 13/5804 439/358 |
| 6,371,776 B1 | * | 4/2002 | Li ...................... | H01R 43/0263 439/135 |

(Continued)

OTHER PUBLICATIONS

Nash, S., "Circuitnet," Jul. 16, 2018, http://www.circuitnet.com/experts/86336.html.

*Primary Examiner* — Harshad C Patel

(74) *Attorney, Agent, or Firm* — Jaffery Watson Mendonsa & Hamilton

(57) ABSTRACT

Apparatus including an elongated body to couple with a surface mount connector to reduce or prevent deformation of the surface mount connector during soldering of the surface mount connector to a substrate, the surface mount connector including a connector housing having a first end portion and a second end portion. In one implementation, the elongated body may include: a first body end portion forming a first tab insertable into a first portion of a socket defined by the first housing end portion; and a second body end portion forming a second tab insertable into a second portion of the socket defined by the second housing end portion.

19 Claims, 40 Drawing Sheets

(56) References Cited

U.S. PATENT DOCUMENTS

| | | | | |
|---|---|---|---|---|
| 6,506,064 B1* | 1/2003 | Wu | H01R 43/205 | 439/135 |
| 6,755,672 B2* | 6/2004 | Lai | H01R 13/44 | 174/138 F |
| 6,980,437 B2* | 12/2005 | Bright | H04B 1/036 | 165/185 |
| 7,323,892 B1 | 1/2008 | Lameres | G01R 1/07328 | 324/750.25 |
| 7,479,044 B1* | 1/2009 | MacCrindle | H01R 33/09 | 439/699.2 |
| 7,518,873 B2* | 4/2009 | Park | H01L 23/4093 | 165/185 |
| 7,539,018 B2* | 5/2009 | Murr | H05K 7/20418 | 165/185 |
| 7,544,072 B2* | 6/2009 | Rubenstein | H01R 13/4538 | 439/135 |
| 8,251,712 B2* | 8/2012 | Cheng | H01R 12/7082 | 439/329 |
| 8,371,861 B1* | 2/2013 | Cina | H01R 12/721 | 257/215 |
| 8,444,437 B2* | 5/2013 | Szczesny | H01R 13/6587 | 361/704 |
| 8,556,558 B1* | 10/2013 | Hunt | F16B 13/141 | 411/395 |
| 8,559,180 B2 | 10/2013 | Brown et al. | | |
| 8,670,236 B2* | 3/2014 | Szczesny | H05K 9/0009 | 165/104.33 |
| 8,764,457 B2* | 7/2014 | Chen | H05K 7/142 | 361/810 |
| 9,225,115 B2* | 12/2015 | Malek | H01R 12/7047 | |
| 10,242,941 B1 | 3/2019 | Su et al. | | |
| 2003/0027445 A1* | 2/2003 | Carney | H01R 13/5213 | 439/135 |
| 2007/0155059 A1 | 7/2007 | Lee et al. | | |
| 2007/0183128 A1* | 8/2007 | Pirillis | H05K 9/0058 | 361/715 |
| 2010/0093193 A1* | 4/2010 | Trout | H01R 12/523 | 439/74 |
| 2019/0099820 A1 | 4/2019 | Su et al. | | |

* cited by examiner

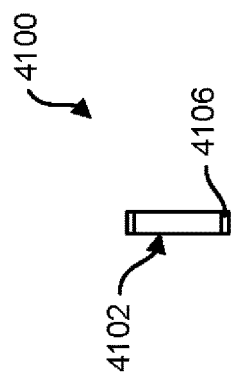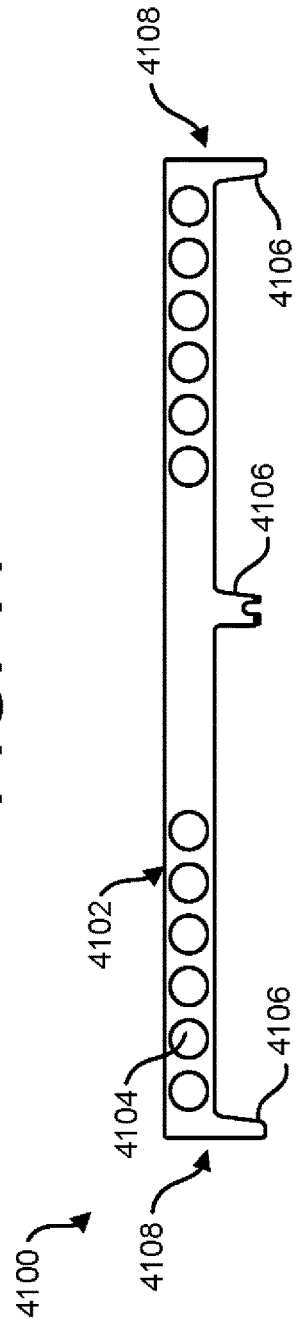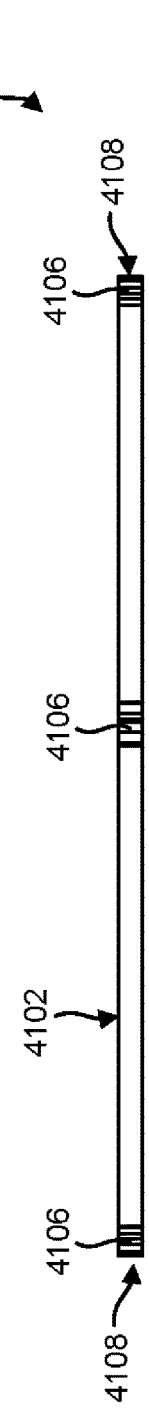

APPARATUS FOR SURFACE MOUNT CONNECTORS

BACKGROUND

Generally, soldering is an elemental process in the manufacture of electronic equipment. Soldering allows for two or more components to be joined together by melting and placing a filler material, such as solder, into a joint formed between the two or more components. Soldering may be utilized as it enables electrical conductivity and provides at least some mechanical strength. Soldering may be carried out through the application of heat generated by, for example, a soldering iron or oven.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

FIGS. 33A-35A are respective front, side, and top views of an apparatus, according to one or more examples of the disclosure.

FIGS. 33B-35B are respective front, side, and top views of an apparatus, according to one or more examples of the disclosure.

FIGS. 41-43 are respective front, side, and top views of an apparatus, according to one or more examples of the disclosure.

DETAILED DESCRIPTION

Figure 1:
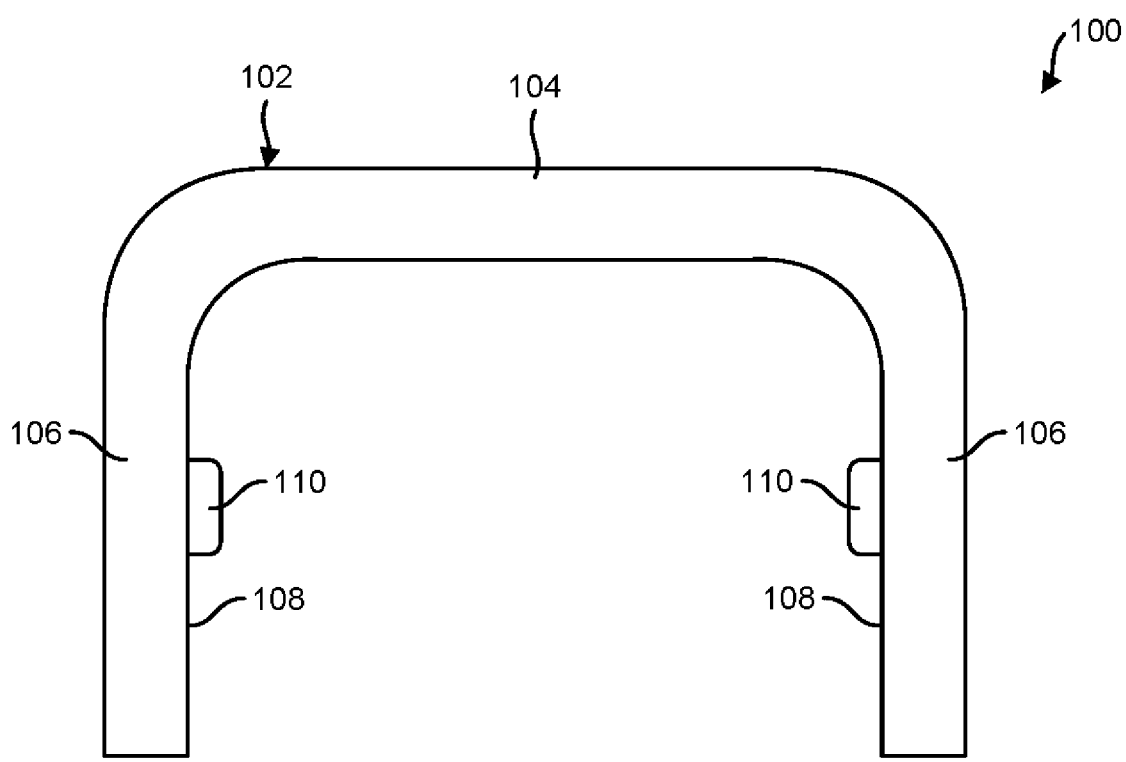
FIGS. 1-3 are respective front, side, and top views of an apparatus, according to one or more examples of the disclosure.

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Further, as used herein, the articles "a" and "an" are intended to have their ordinary meaning in the patent arts, namely "one or more." Moreover, examples herein are intended to be illustrative only and are presented for discussion purposes and not by way of limitation.

Modern module manufacturing has evolved from wired components mostly assembled by hand, to surface-mounted components assembled in an automated process referred to generally as surface mount technology (SMT). SMT may be used to assemble surface mount devices (SMDs) comprised of surface mount components mounted to a substrate, such as a printed circuit board (PCB). SMT enables module manufacturing to be optimized with regard to a cost-effective, high-quality, and less error-prone production process.

To mount a surface mount connector to a PCB, the surface mount connector has solderable connection surfaces (e.g., leads) that are soldered directly onto a surface of the PCB. To facilitate the foregoing, contact surfaces, generally referred to as pads, on the top and/or bottom side of the PCB are printed with solder paste. The solder paste may be, for example, a mixture of solder powder and flux. The leads of the surface mount connector are set into the solder paste on the PCB and then soldered in a reflow oven.

In the reflow oven, the solder paste is subjected to heat energy, e.g., infrared radiation, and heated to the liquidus temperature of the solder, at which time the solder melts. As the solder cools and solidifies, the solder joins the connector leads to the pads of the PCB, thereby forming solid solder joints in a cool-down zone of the reflow oven. The SMD, also referred to as a printed circuit assembly (PCA), may then be manually inspected or passed through a machine, such as an Automatic Optical Inspection (AOI) machine, which runs a number of visual quality checks on the SMD. Such visual quality checks may include, for example, alignment of the surface mount connectors and checking for solder bridges. After exiting the AOI machine, the SMD may be subjected to further inspection and testing based on standard operating practices of the manufacturer.

As the solder paste is heated in the reflow oven, the surface mount connector(s) in the reflow oven are also subjected to heat energy (e.g., infrared radiation). Accordingly, surface mount connectors are generally constructed from plastic materials, such as polyamides, liquid crystal polymers, and polycyclohexylenedimethylene terephthalate (PCT), having short-term, high temperature resistance. The plastic material may be selected based on factors, such as, for example, the planned geometry of the surface mount connector, the temperature load in the reflow oven, and economic considerations, such as the planned expenditure for packaging.

Although constructed from short-term, high temperature resistant plastic materials, some surface mount connectors may deform in response to being subjected to the heat energy in the reflow oven. For example, surface mount connectors, such as DDR4 connectors and DDR5 connectors (collectively referred to as DDRx connectors), may deform (e.g., warp) such that end portions thereof may lift from the PCB in the reflow oven. The lifting of each end portion causes lifting of the leads from the respective contact surfaces of the PCB, which may result in an un-reliable connection (partially lifted lead) or, in some cases, an open connection (fully lifted lead).

To prevent deformation of the surface mount connectors, in some instances, weight blocks are disposed on top of the end portions of a bank of surface mount connectors in an effort to keep the end portions of the surface mount connectors flat and in contact with the PCB during the soldering process within the heat flow oven. Although potentially effective in keeping the end portions of the surface mount connectors flat and in contact with the PCB, the addition of weight blocks has certain drawbacks.

For example, one such drawback is that adding the weight blocks to the bank of surface mount connectors acts to tie the position of all the SMT connectors into a positional unit, interfering with the ability of each connector's solder joints to "float" into ideal alignment, which is normally accomplished by surface tension of the molten solder across all connector PCB pads. Another example drawback is that adding the weight blocks to a surface mount connector may introduce higher risks of cold joint formations at their locations in case of thermal-profile variations. Still further, another example drawback is that adding weight blocks may cause significantly shorter solder joint stand-off height which may directly affect solder joint reliability.

Accordingly, examples of the present disclosure are directed to apparatus for reducing, and in some instances, preventing the deformation of surface mount connectors subjected to heat energy while addressing the drawbacks provided above. In particular, the apparatus of the present disclosure enables: a lack of interference with the self-alignment of the leads of the surface mount connector; substantially reduced risk of cold joint formations for a given thermal profile; and minimum solder joint variability throughout the connections.

More particularly, in one example of the present disclosure, an apparatus may include an elongated body to couple with a surface mount connector to reduce or prevent deformation of the surface mount connector during soldering of the surface mount connector to a substrate. The surface mount connector may include a connector housing having a first end portion and a second end portion. The elongated body may include a center body portion, a first side body portion, and a second side body portion. The center body portion may have a longitudinal axis and a lateral axis and may extend along the longitudinal axis from the first end portion to the second end portion when coupled to the surface mount connector. The first side body portion may extend from a first lateral end portion of the center body portion. The second side body portion may extend from a second lateral end portion of the center body portion opposing the first lateral end portion. The first side body portion and the second side body portion may couple the elongated body with the surface mount connector.

In another example of the present disclosure, an apparatus may include an elongated body to couple with a surface mount connector to reduce or prevent deformation of the surface mount connector during soldering of the surface mount connector to a substrate. The surface mount connector may include a connector housing having a first end portion and a second end portion. The elongated body may include a first side body portion and a second side body portion. The first body end portion may form a first tab insertable into a socket defined by the first housing end portion, and the second body end portion may form a second tab insertable into a socket defined by the second housing end portion.

In another example of the present disclosure, an apparatus may include an elongated body to couple with a surface mount connector to reduce or prevent deformation of the surface mount connector during soldering of the surface mount connector to a substrate. The surface mount connector may include a connector housing having a first end portion and a second end portion. The elongated body may include a vertically extending portion insertable within a socket defined by the connector housing of the surface mount connector, such that the elongated body may extend from the first end portion to the second end portion of the connector housing.

Figure 2:
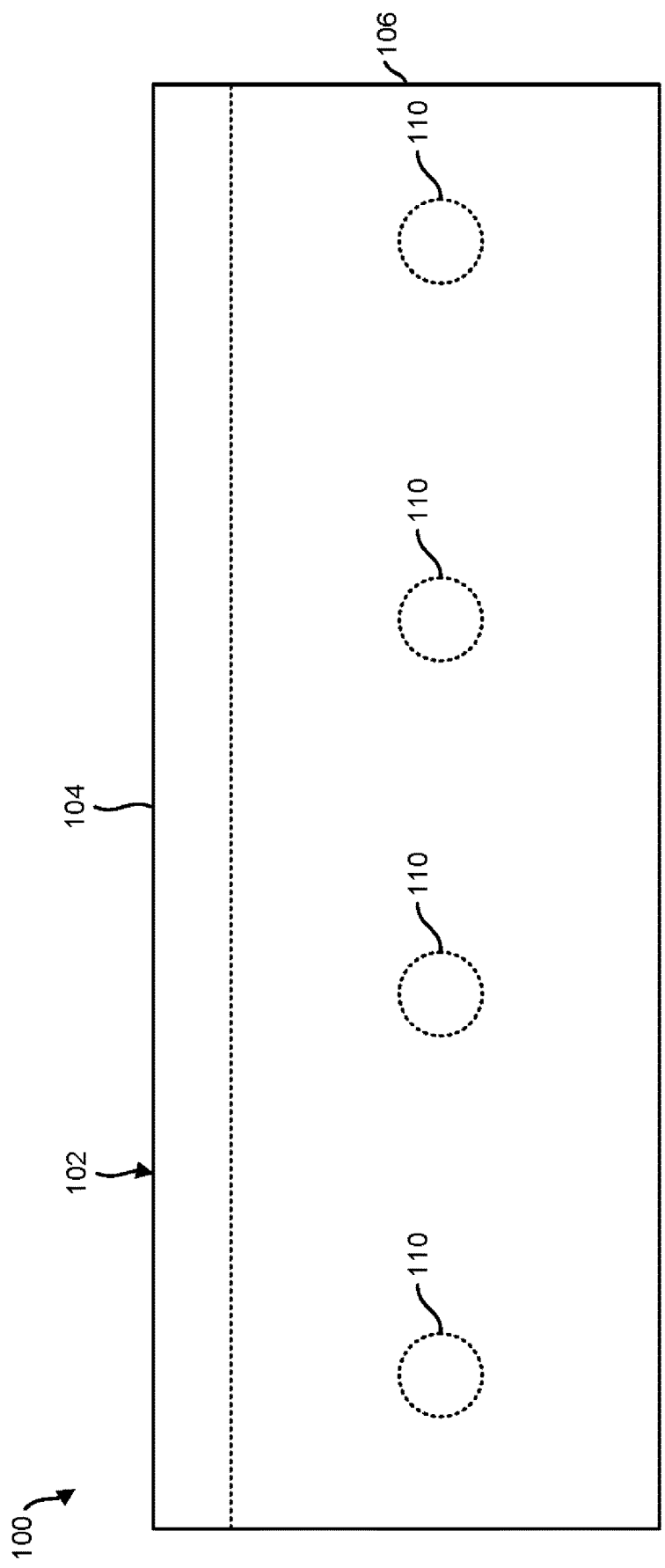
Figure 3:
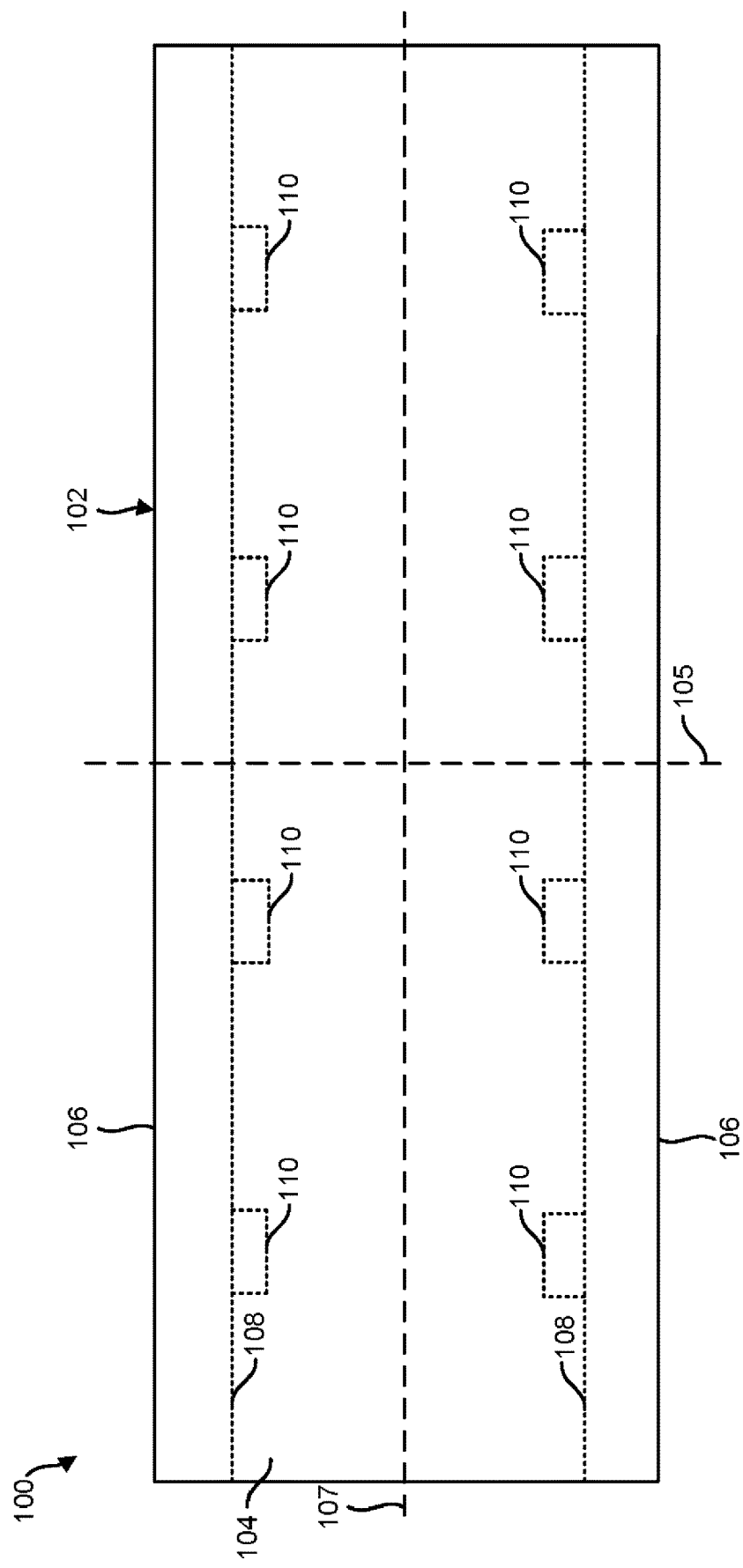
Figure 4:
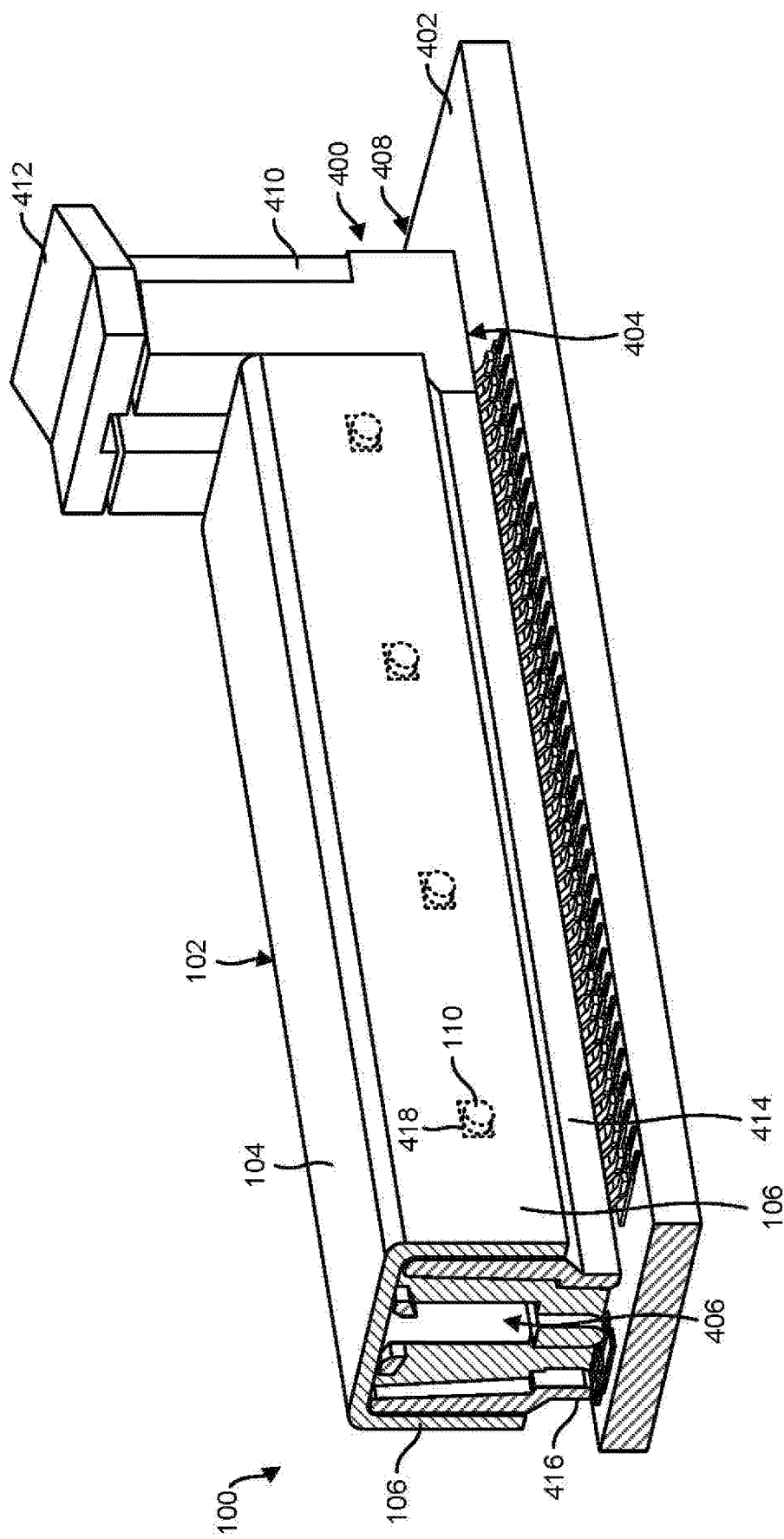
FIG. 4 is a cutaway view of the apparatus of FIGS. 1-3 coupled to a surface mount connector, according to one or more examples of the disclosure.
Figure 5:
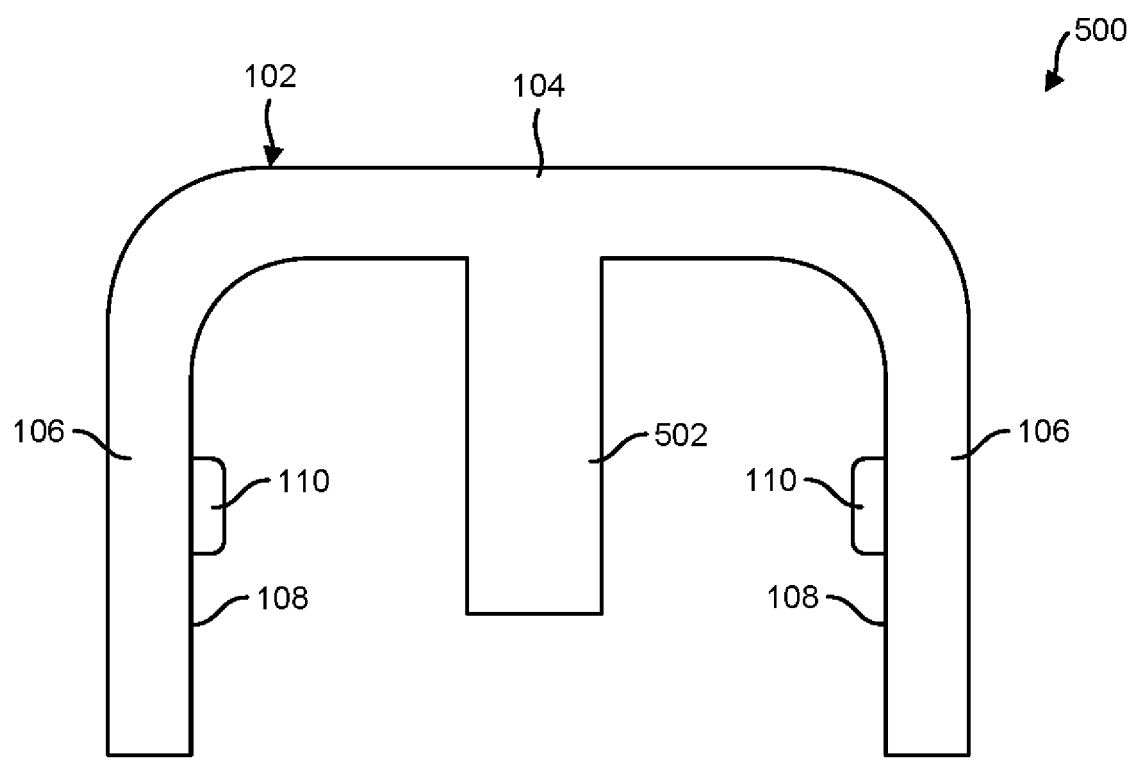
FIGS. 5-7 are respective front, side, and top views of an apparatus, according to one or more examples of the disclosure.
Figure 6:
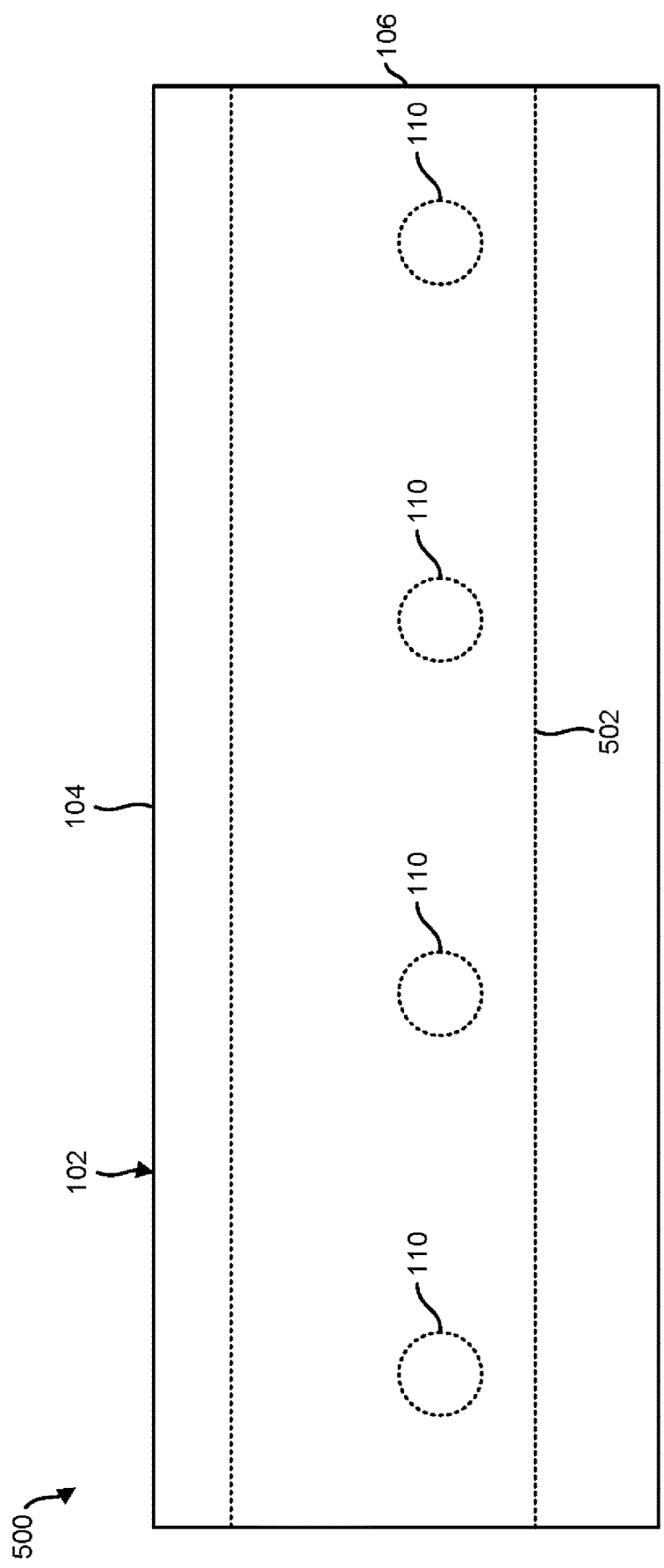
Figure 7:
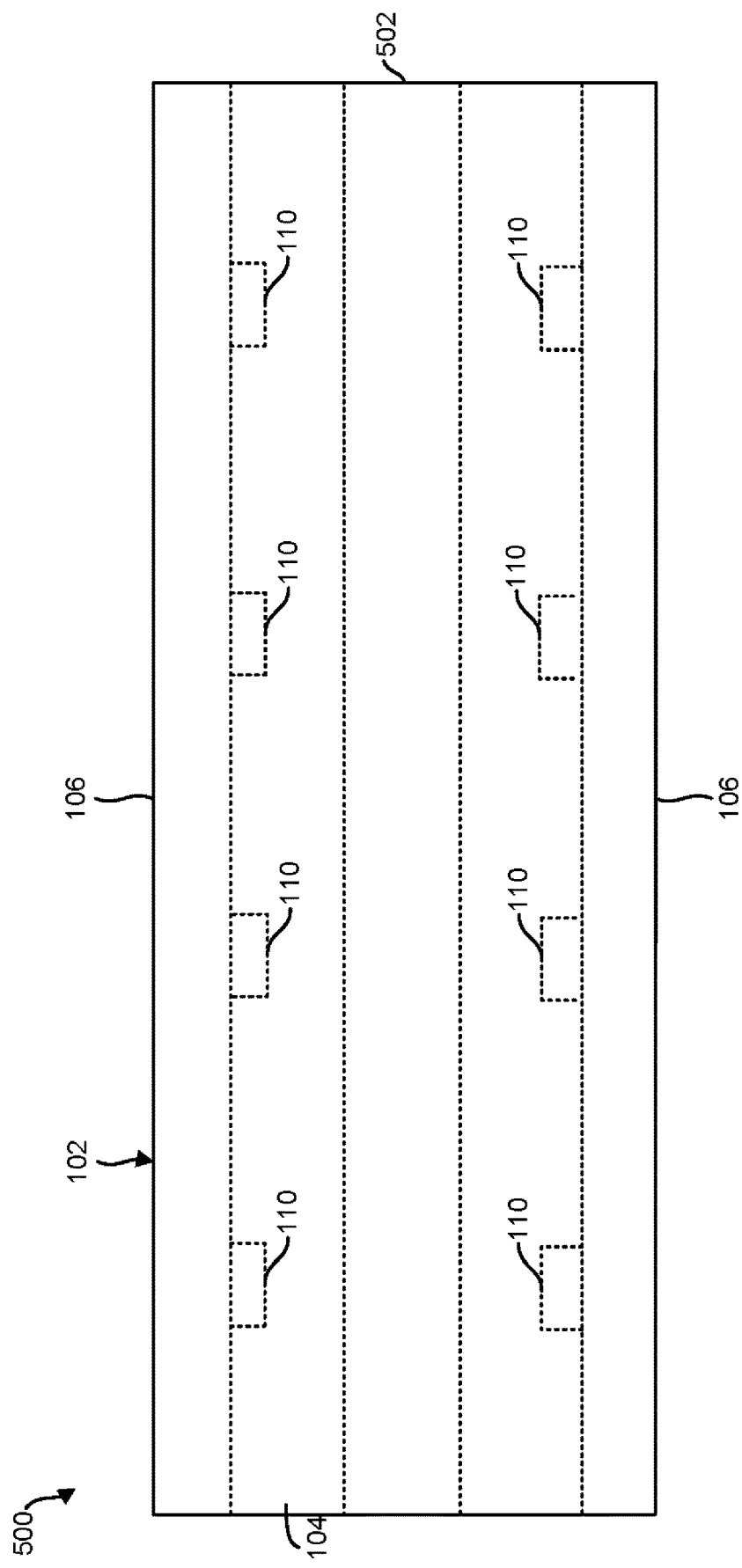

Turning now to the drawings, FIGS. 1-3 illustrate respective front, side, and top views of an apparatus 100, and FIG. 4 is a cutaway view of the apparatus 100 of FIGS. 1-3 coupled to a surface mount connector 400, according to one or more examples of the disclosure. The apparatus 100 may be configured to couple to the surface mount connector 400 prior to a pick and place operation or, in other examples, after the surface mount connector 400 is set into a solder paste disposed on a substrate, such as a printed circuit board (PCB) (402, FIG. 4), during an automated manufacturing process referred to in the art as surface mount technology (SMT). Example surface mount connectors 400 may include SMT DDR4 connectors and SMT DDR5 connectors (referred to collectively herein as SMT DDRx connectors). However, the present disclosure is not limited thereto, and other example surface mount connectors may include any narrow, cartridge-type connector mountable during SMT, such as, for example, high speed bus interface and Peripheral Connector Interconnect Express (PCIe) connectors.

The apparatus 100 may be further configured to reduce, and in some instances, prevent deformation (e.g., warpage) of the surface mount connector 400 subjected to heat energy in a reflow oven during SMT. To that end, the apparatus 100 may be constructed from a heat resistant material, such as steel, ceramic, or titanium, and may include an elongated, inverted U-shaped body 102 extending longitudinally and having a center body portion 104 and two side body portions 106. As illustrated in FIGS. 1-3, each side body portion 106 may extend from the center body portion 104 at a respective lateral end thereof in a direction substantially perpendicular (within +/−10 degrees of a right angle) to a lateral axis 105 and a longitudinal axis 107 of the center body portion 104. In one or more examples, the side body portions 106 may be substantially parallel (within +/−10 degrees) to one another, and each side body portion 106 may include an inner surface 108 opposing and facing the inner surface 108 of the other side body portion 106.

The inner surfaces 108 of the side body portions 106 may each include a plurality of protrusions 110 extending therefrom. Additionally, in one or more implementations, the inner surfaces 106 may define a plurality of apertures or slots (not shown) to aid in the radiant heat transfer into the surface mount connector 400. As illustrated in FIGS. 1-3, each inner surface 108 may include four equally-spaced protrusions 110 having a cylindrical shape; however, the present disclosure is not limited thereto, and in other examples, each inner surface 108 may have two, three, or five or more protrusions 110, and one or more protrusions 110 may have a polygonal shape. Further, in some examples, the protrusions 110 may be inconsistently spaced and/or one inner surface 108 may have fewer protrusions 110 than the other inner surface 108.

As illustrated in FIG. 4, the surface mount connector 400 may include a connector housing 404 defining a socket 406 extending between opposing end portions 408 of the connector housing 404. Although only one end portion 408 is shown for purposes of the cutaway view, those of skill in the art will appreciate that the end portions 408 are the same in form and function. Each end portion 408 of the connector housing may include a tower 410 further defining the socket 406. Each tower 410 may further include a latch 412 to secure an electronic component (e.g., dual inline memory module (DIMM)—not shown) within the socket 406.

The connector housing 404 may have a first outer wall 414 extending between the opposing end portions 408 and a second outer wall 416 extending between the opposing end portions 408 and opposing the first outer wall 414. Each of the first outer wall 414 and the second outer wall 416 may define a plurality of cavities 418 sized and configured to receive a respective protrusion 110 of the plurality of protrusions 110 of the apparatus 100 when coupled thereto. In one or more examples, the cavities 418 may be premolded in the first outer wall 414 and the second outer wall 416 of the connector housing 404.

To couple the apparatus 100 to the surface mount connector 400 as illustrated in FIG. 4, the apparatus 100 is placed over the surface mount connector 400 such that each side body portion 106 of the apparatus 100 is placed into contact with a respective outer wall 414, 416 of the surface mount connector 400. Each protrusion 110 of the apparatus 100 is guided and inserted into a respective cavity 418 of the connector housing 404, thereby coupling the apparatus 100 to the surface mount connector 400.

As coupled to the surface mount connector 400, the apparatus 100 provides structural rigidity to the surface mount connector 400. Accordingly, during the application of heat energy to the surface mount connector 400 in, for example, a reflow oven, and thereafter as the solder cools, the apparatus 100 reduces, and in some instances, prevents the end portions 408 of the surface mount connector 400 from lifting off the PCB 402 or otherwise warping in shape, thereby resulting in the surface mount connector 400 remaining flat (i.e., without curvature) during the thermal excursion of the soldering process. As a result of such, the solder forms appropriate solder joints and an acceptable connection is made between the leads of the surface mount connector 400 and the PCB 402. After SMT, the apparatus 100 may be decoupled from the surface mount connector 400 and an electronic component (e.g., DIMM—not shown) may be inserted into the socket 406.

Referring now to FIGS. 5-8, respective front, side, and top views of an apparatus 500 are shown in FIGS. 5-7, and FIG. 8 is a cutaway view of the apparatus 500 coupled to the surface mount connector 400, according to one or more examples of the disclosure. The apparatus 500 may be similar in some aspects to the apparatus 100, and thus, like numbers will refer to like components, which will not be discussed again in detail for the sake of brevity. The apparatus 500 may include a center support 502 extending from the center body portion 104 between and in a substantially parallel arrangement (within +/−10 degrees) with the side body portions 106. The center support 502 may be sized and configured to be inserted into the socket 406 of the surface mount connector 400 at least as far as an electronic component (not shown) would be inserted. Accordingly, in one or more examples, the center support 502 may be thinner than an electronic component, such as a DIMM. As inserted into the socket 406, the center support 502 adds additional reinforcement to prevent the surface mount connector 400 from deforming during SMT.

Figure 8:
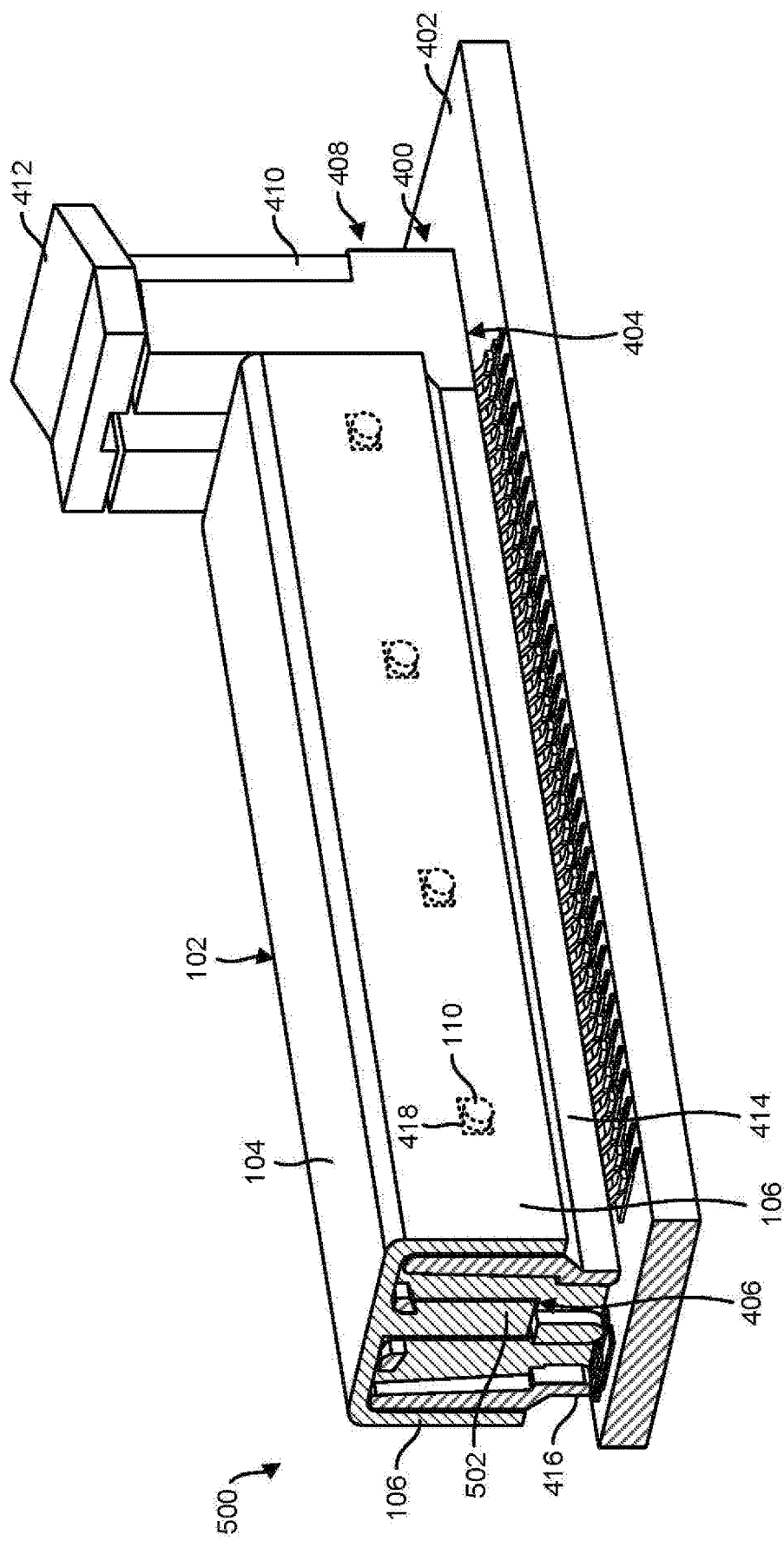
FIG. 8 is a cutaway view of the apparatus of FIGS. 5-7 coupled to a surface mount connector, according to one or more examples of the disclosure.

To couple the apparatus 500 to the surface mount connector 400 as illustrated in FIG. 8, the apparatus 500 is placed over the surface mount connector such that each side body portion 106 of the apparatus 500 is placed into contact with a respective outer wall 414, 416 of the surface mount connector 400. In addition, the center support 502 may be guided into alignment with the socket 406. As the center support 502 is inserted into the socket 406 of the surface mount connector 400, each protrusion 110 of the apparatus 500 is guided and inserted into a respective cavity 418 of the connector housing 404, thereby coupling the apparatus 500 to the surface mount connector 400.

Figure 14:
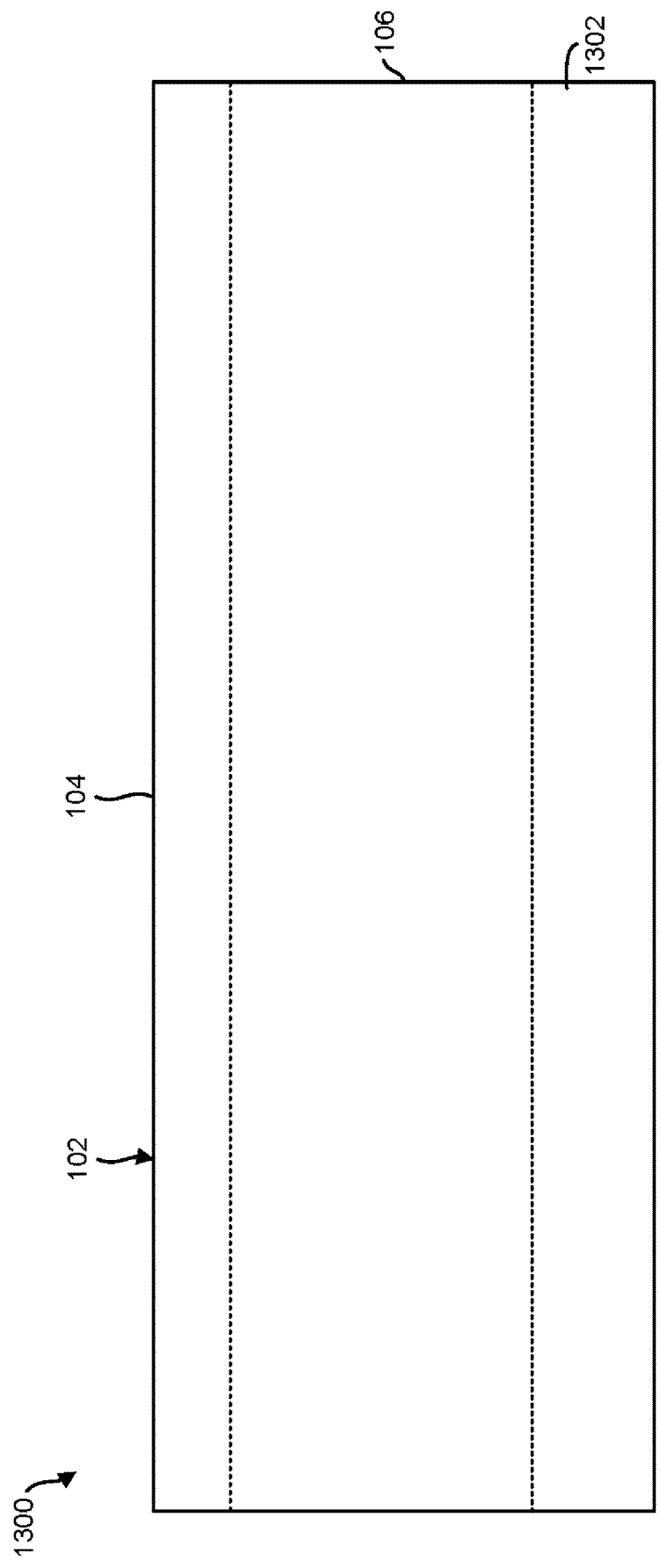
Figure 15:
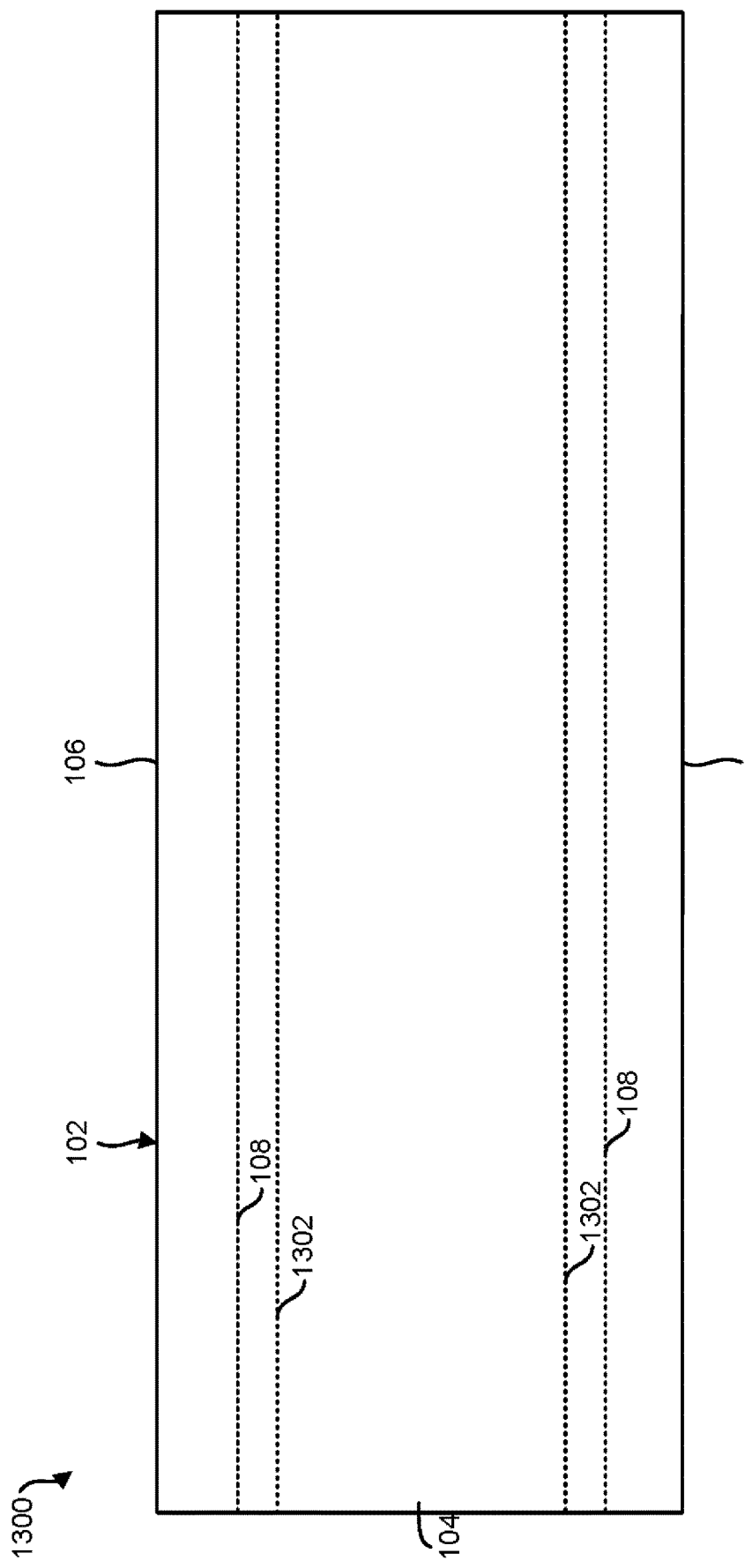

As coupled, the apparatus 500 provides structural rigidity to the surface mount connector 400. The addition of the center support 502 may provide enhanced structural support relative to the apparatus 100 of FIG. 14. Accordingly, during the application of heat energy to the surface mount connector 400 in, for example, a reflow oven, and thereafter as the solder cools, the apparatus 500 reduces, and in some instances, prevents the end portions 408 of the surface mount connector 400 from lifting off the PCB 402 or otherwise warping in shape, thereby resulting in the surface mount connector 400 remaining flat (i.e., without curvature) during the thermal excursion of the soldering process. As a result of such, the solder forms appropriate solder joints and an acceptable connection is made between the leads of the surface mount connector 400 and the PCB 402. After SMT, the apparatus 500 may be decoupled from the surface mount connector 400 and an electronic component (e.g., DIMM—not shown) may be inserted into the socket 406.

Figure 9:
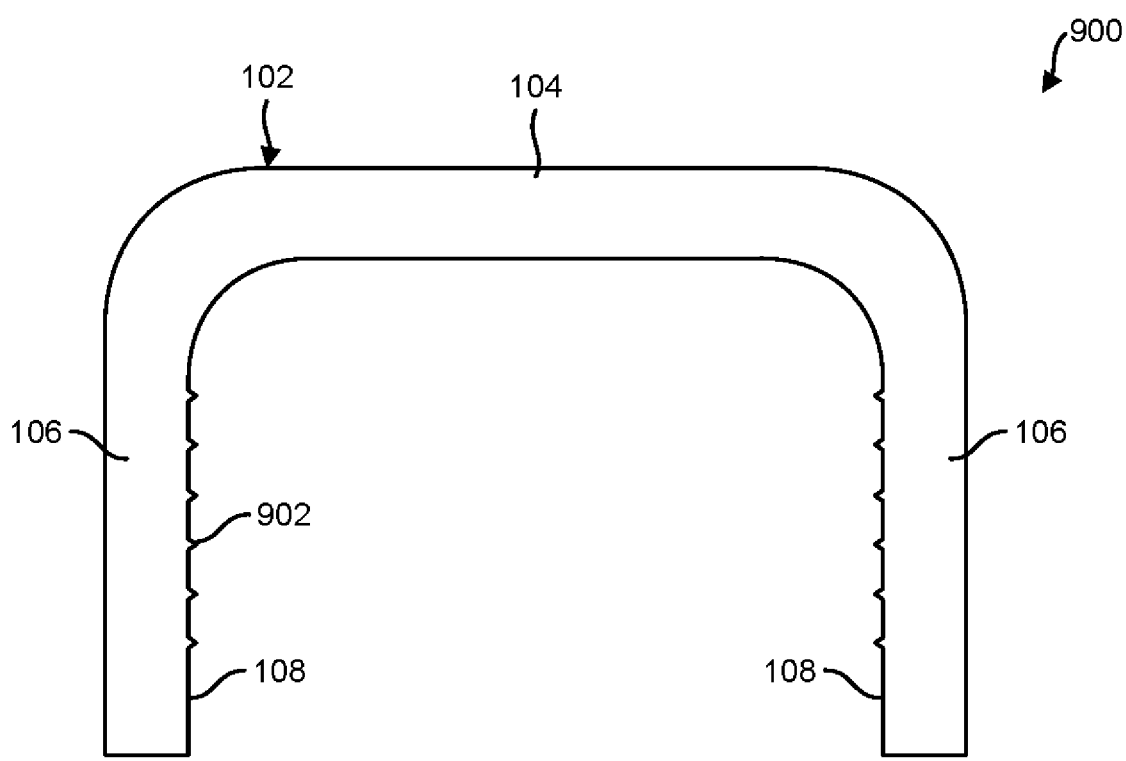
FIGS. 9-11 are respective front, side, and top views of an apparatus, according to one or more examples of the disclosure.
Figure 10:
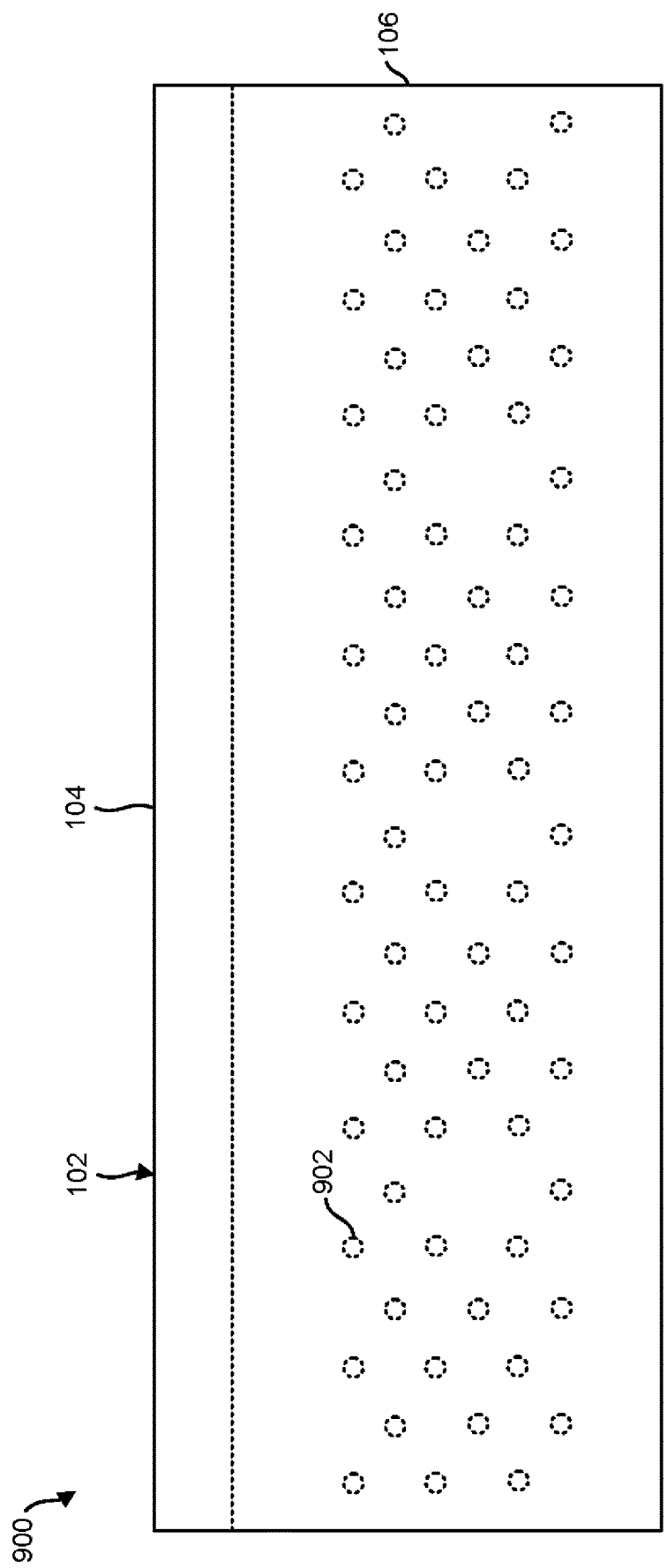
Figure 11:
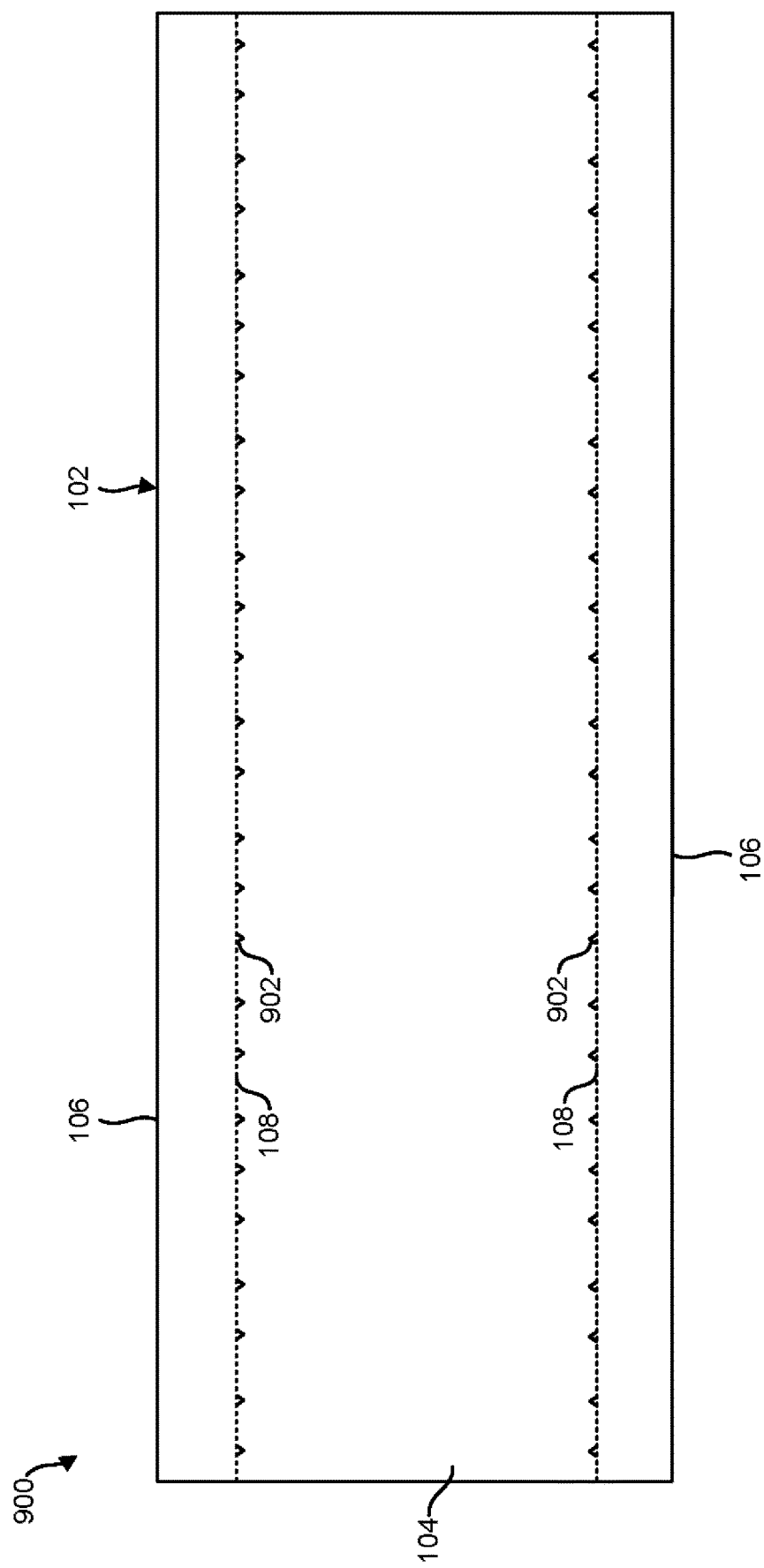

Turning now to FIGS. 9-12, respective front, side, and top views of an apparatus 900 are shown in FIGS. 9-11, and FIG.

12 is a cutaway view of the apparatus 900 coupled to a surface mount connector 1200, according to one or more examples of the disclosure. The apparatus 900 and the surface mount connector 1200 may be similar in some aspects to the respective apparatus 100 and surface mount connector 400; thus, like numbers will refer to like components, which will not be discussed again in detail for the sake of brevity.

As illustrated in FIGS. 9-11, the inner surfaces 108 of the side body portions 106 may each include a plurality of protrusions 902. In one or more examples, the plurality of protrusions 902 may include a plurality of spikes. In other implementations, the protrusions 902 may be ridges, knurls, or stamped patterns. As illustrated in FIGS. 9-11, the plurality of protrusions 902 may be arranged in an array; however, the present disclosure is not limited thereto, and in other examples, the plurality of protrusions 902 may be arranged randomly or in any pattern suitable to couple the apparatus 900 to the surface mount connector 1200 to reduce, or in some cases, prevent deformation of the surface mount connector 1200.

Figure 12:
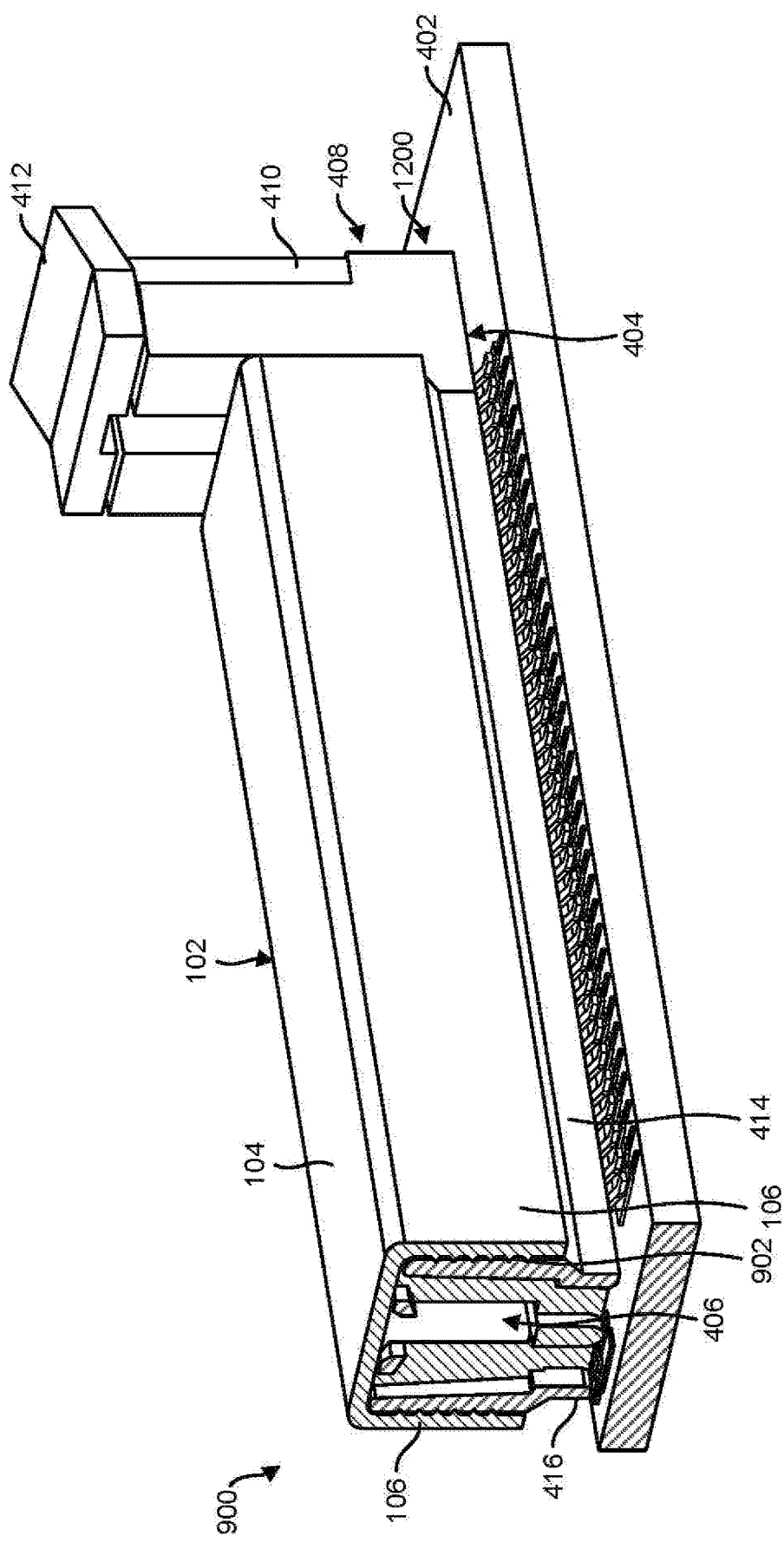
FIG. 12 is a cutaway view of the apparatus of FIGS. 9-11 coupled to a surface mount connector, according to one or more examples of the disclosure.
Figure 13:
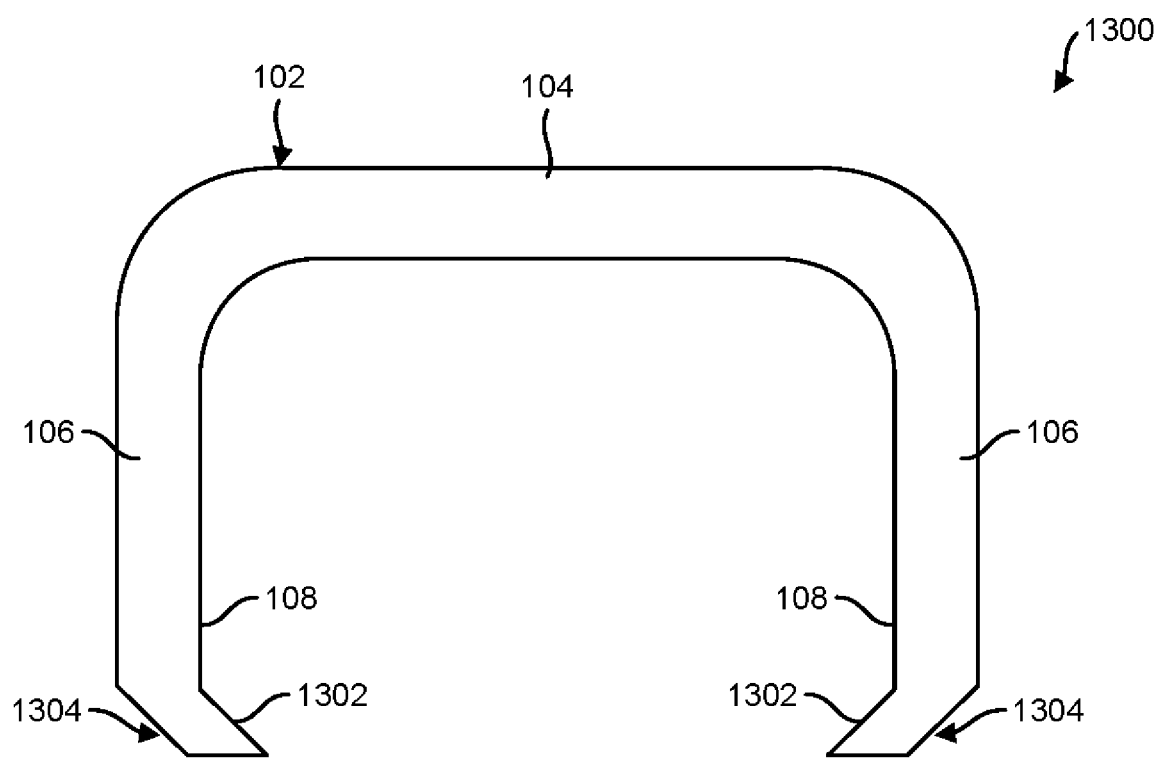
FIGS. 13-15 are respective front, side, and top views of an apparatus, according to one or more examples of the disclosure.

The surface mount connector 1200 may differ from surface mount connector 400 in that the cavities 418 may be omitted from the connector housing 404. Accordingly, to couple the apparatus 900 to the surface mount connector 1200 as illustrated in FIG. 12, the apparatus 900 is placed over the surface mount connector 1200 such that each side body portion 106 of the apparatus 900 is placed into contact with a respective outer wall 414, 416 of the surface mount connector 1200. Each protrusion 902 of the apparatus 900 grips a respective outer wall 414, 416 of the connector housing 404, thereby coupling the apparatus 900 to the surface mount connector 1200.

As coupled to the surface mount connector 1200, the apparatus 900 provides structural rigidity to the surface mount connector 1200. Accordingly, during the application of heat energy to the surface mount connector 1200 in, for example, a reflow oven, and thereafter as the solder cools, the apparatus 900 reduces, and in some instances, prevents the end portions 408 of the surface mount connector 1200 from lifting off the PCB 402 or otherwise warping in shape, thereby resulting in the surface mount connector 1200 remaining flat (i.e., without curvature) during the thermal excursion of the soldering process. As a result of such, the solder forms appropriate solder joints and an acceptable connection is made between the leads of the surface mount connector 1200 and the PCB 402. After SMT, the apparatus 900 may be decoupled from the surface mount connector 1200 and an electronic component (e.g., DIMM—not shown) may be inserted into the socket 406.

Referring now to FIGS. 13-16, respective front, side, and top views of an apparatus 1300 are shown in FIGS. 13-15, and FIG. 16 is a cutaway view of the apparatus 1300 coupled to the surface mount connector 1200, according to one or more examples of the disclosure. The apparatus 1300 may be similar in some aspects to the apparatus 100, and thus, like numbers will refer to like components, which will not be discussed again in detail for the sake of brevity. The side body portions 106 of the apparatus 1300 may include respective lips 1302 extending inward from end portions 1304 of the side body portions 106. As configured, each lip 1302 is angled to engage with a respective angled in-step 1202 defined by the respective first outer wall 414 and second outer wall 416 of the connector housing 404. Accordingly, in view of the lips 1302, the protrusions 110 as detailed in the apparatus 100 of FIG. 1 may be omitted from the inner surfaces 108 of the side body portions 106 of the apparatus 1300. Additionally, in one or more implementations, the inner surfaces 106 may define a plurality of apertures or slots (not shown) to aid in the radiant heat transfer into the connector housing 404 of the surface mount connector 1200.

Figure 16:
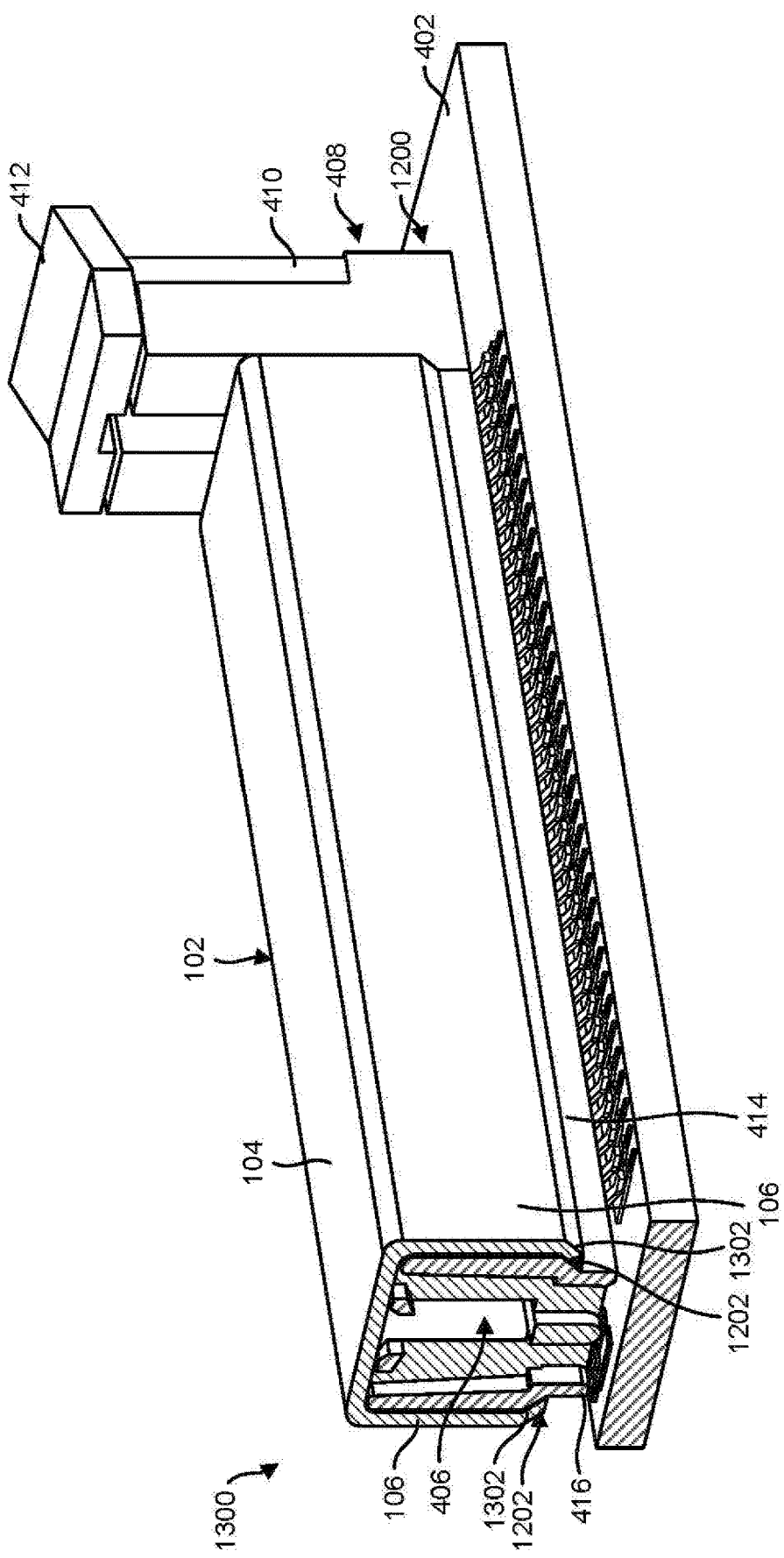
FIG. 16 is a cutaway view of the apparatus of FIGS. 13-15 coupled to a surface mount connector, according to one or more examples of the disclosure.
Figure 17:
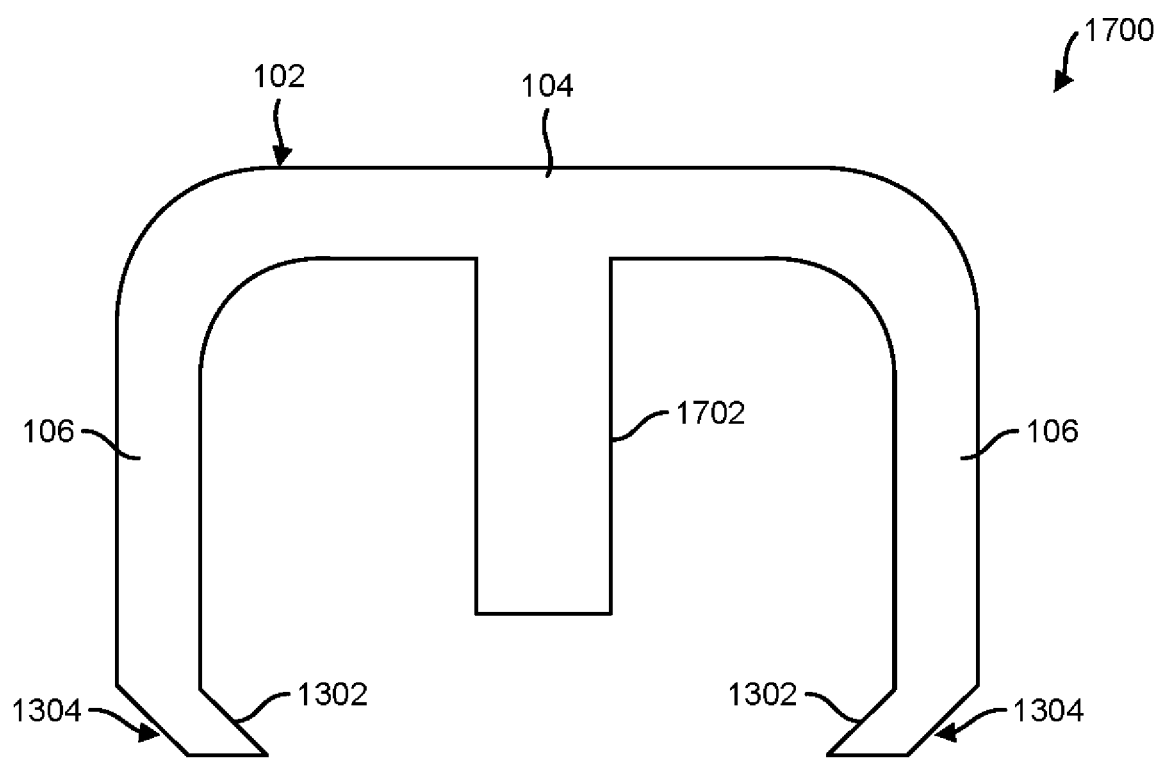
FIGS. 17-19 are respective front, side, and top views of an apparatus, according to one or more examples of the disclosure.
Figure 18:
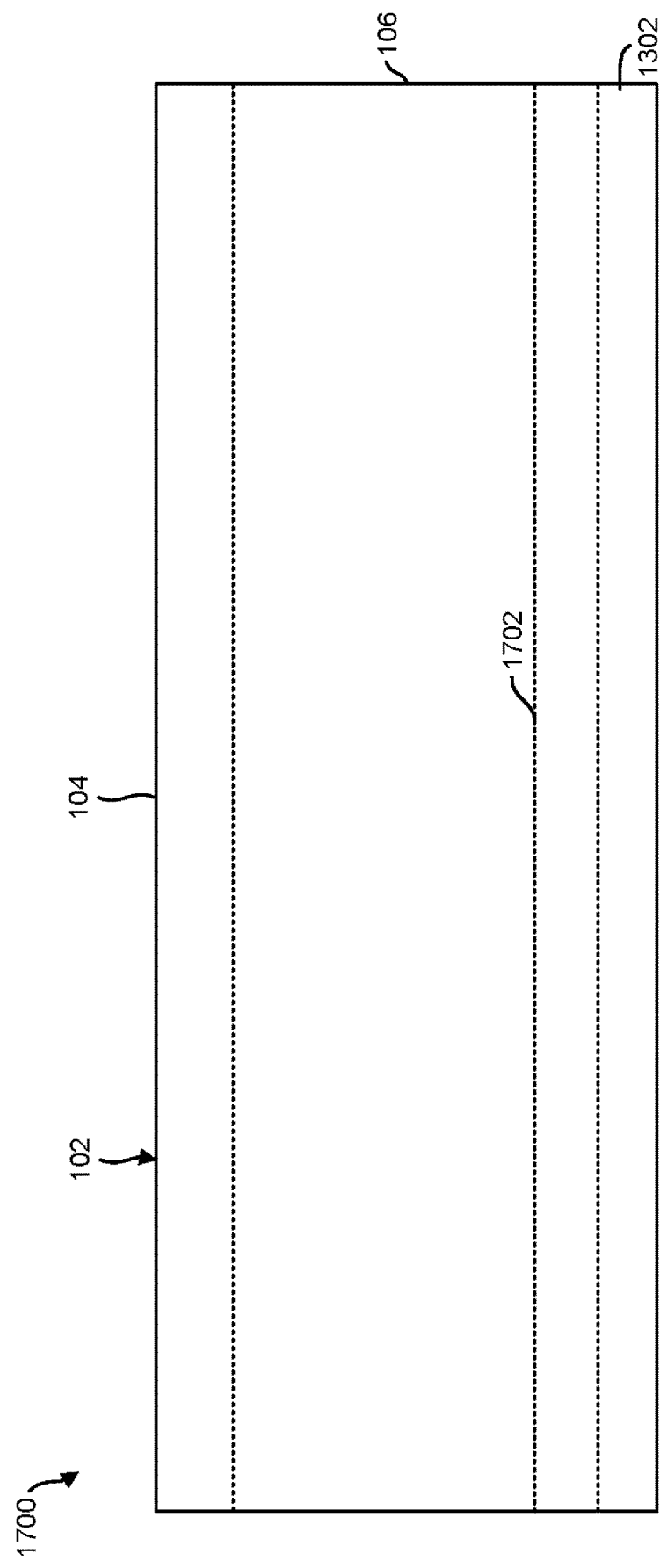
Figure 19:
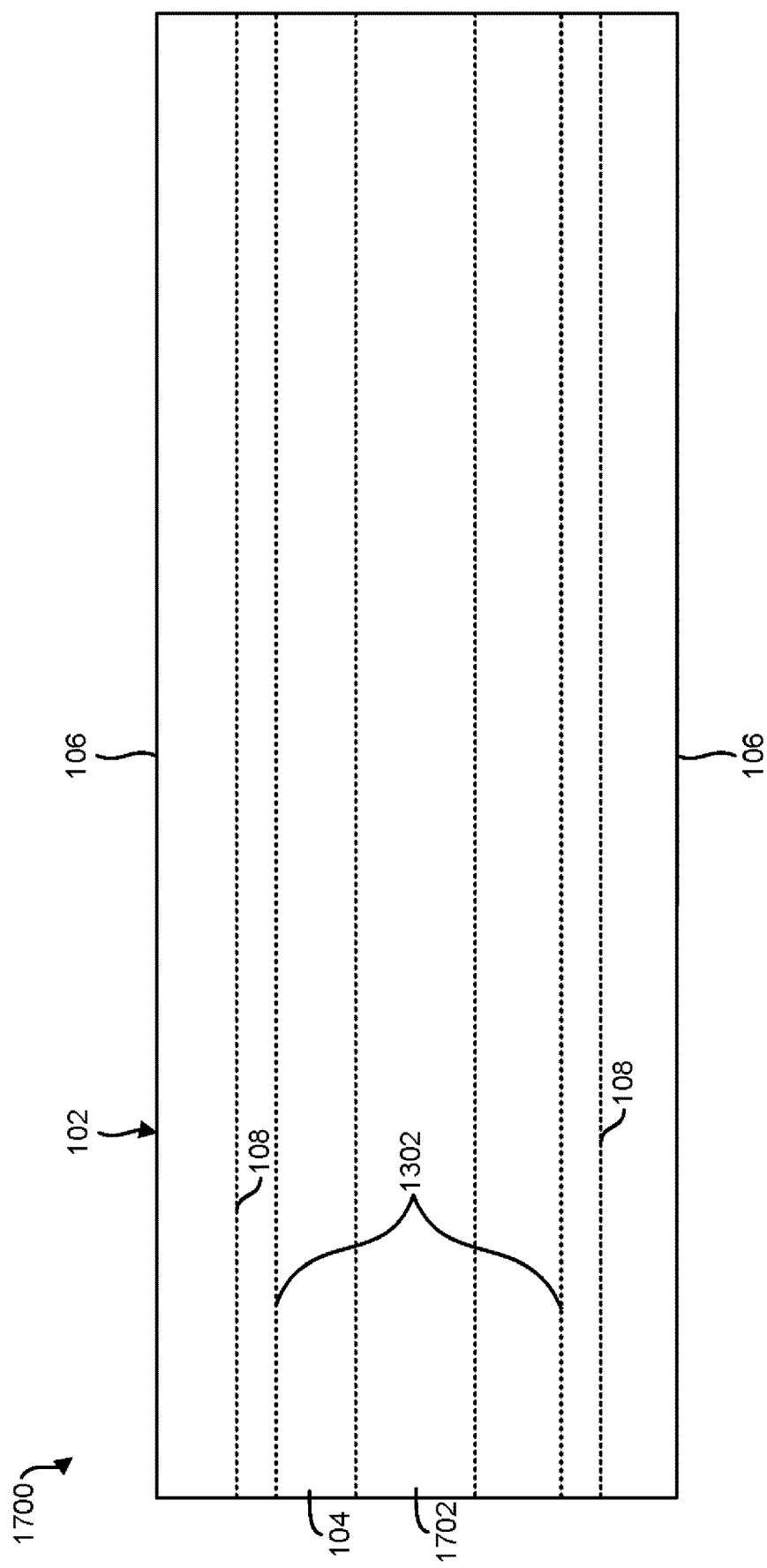

To couple the apparatus 1300 to the surface mount connector 1200 as illustrated in FIG. 16, the apparatus 1300 is placed over the surface mount connector 1200 such that each side body portion 106 of the apparatus 1300 is placed into contact with a respective outer wall 414, 416 of the connector housing 404. Each lip 1302 of the apparatus 1300 is guided into engagement with a respective angled in-step 1202, thereby coupling the apparatus 1300 to the surface mount connector 1200.

As coupled to the surface mount connector 1200, the apparatus 1300 provides structural rigidity to the surface mount connector 1200. Accordingly, during the application of heat energy to the surface mount connector 1200 in, for example, a reflow oven, the apparatus 1300 reduces, and in some instances, prevents the end portions 408 of the surface mount connector 1200 from lifting off the PCB 402 or otherwise warping in shape, thereby resulting in the surface mount connector 1200 remaining flat (i.e., without curvature) during the thermal excursion of the soldering process. As a result of such, the solder forms appropriate solder joints and an acceptable connection is made between the leads of the surface mount connector 1200 and the PCB 402. After SMT, the apparatus 1300 may be decoupled from the surface mount connector 1200 and an electronic component (e.g., DIMM—not shown) may be inserted into the socket 406.

Turning now to FIGS. 17-20, respective front, side, and top views of an apparatus 1700 are shown in FIGS. 17-19, and FIG. 20 is a cutaway view of the apparatus 1300 coupled to the surface mount connector 1200, according to one or more examples of the disclosure. The apparatus 1700 may be similar in some aspects to the apparatus 1300, and thus, like numbers will refer to like components, which will not be discussed again in detail for the sake of brevity. The apparatus 1700 may include a center support 1702 extending from the center body portion 104 between and in a substantially parallel arrangement (within +/−10 degrees) with the side body portions 106. The center support 1702 may be sized and configured to be inserted into the socket 406 of the surface mount connector 1200 at least as far as an electronic component would be inserted. Accordingly, in one or more examples, the center support 1702 may be thinner than an electronic component, such as a DIMM. As inserted into the socket 406, the center support 1702 adds additional reinforcement to prevent the surface mount connector 1200 from deforming during SMT.

Figure 20:
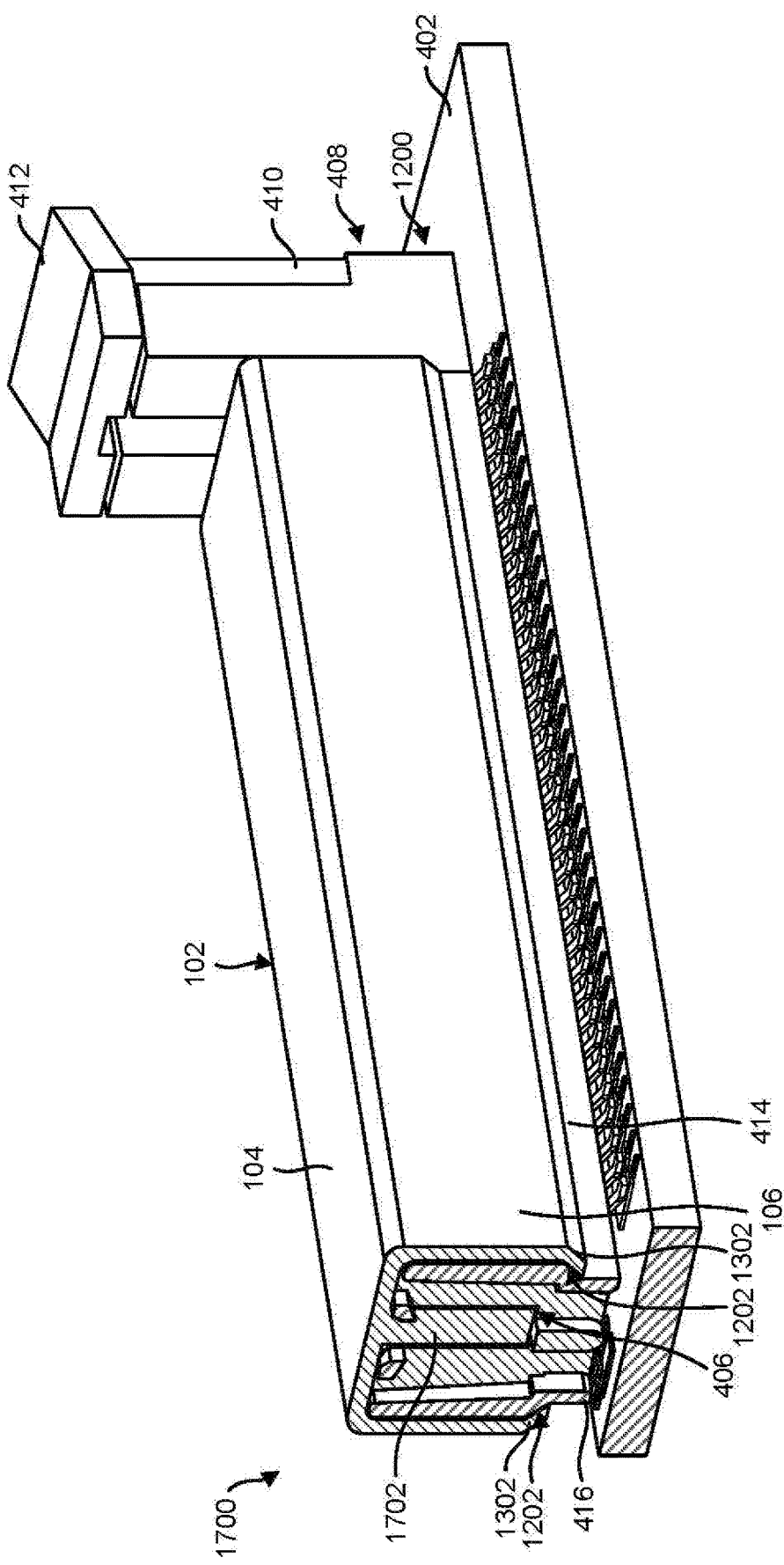
FIG. 20 is a cutaway view of the apparatus of FIGS. 17-19 coupled to a surface mount connector, according to one or more examples of the disclosure.
Figure 21:
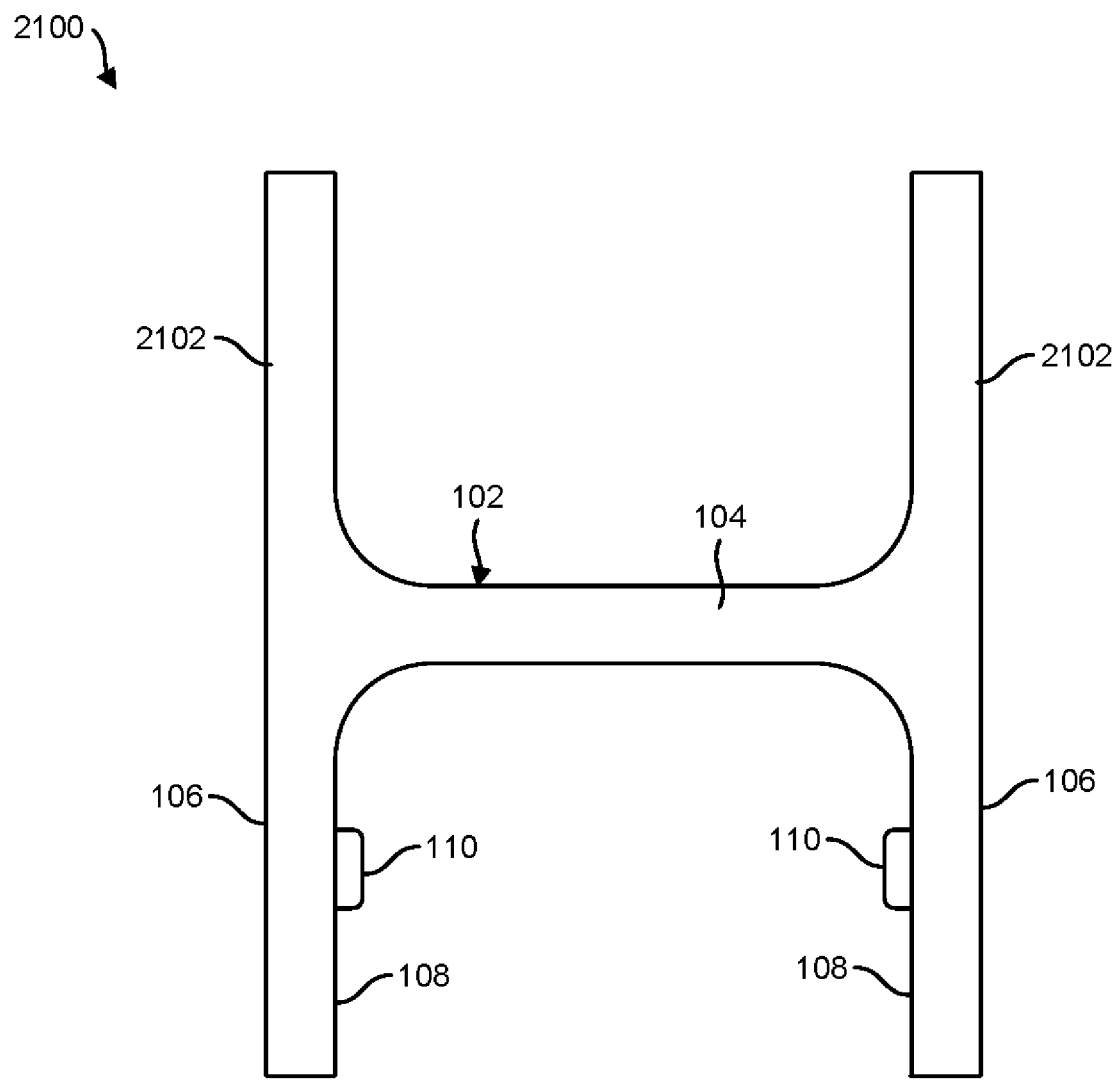
FIGS. 21-23 are respective front, side, and top views of an apparatus, according to one or more examples of the disclosure.
Figure 22:
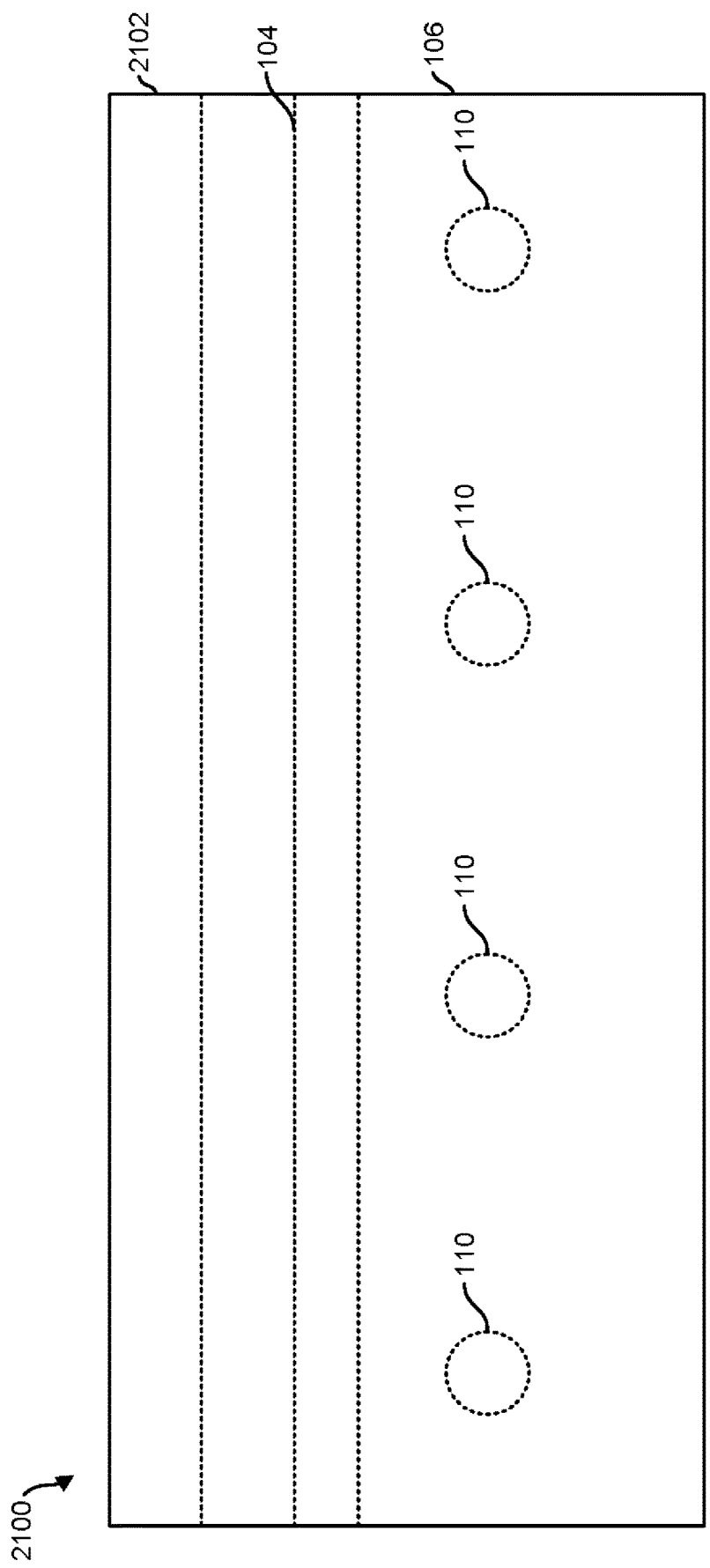
Figure 23:
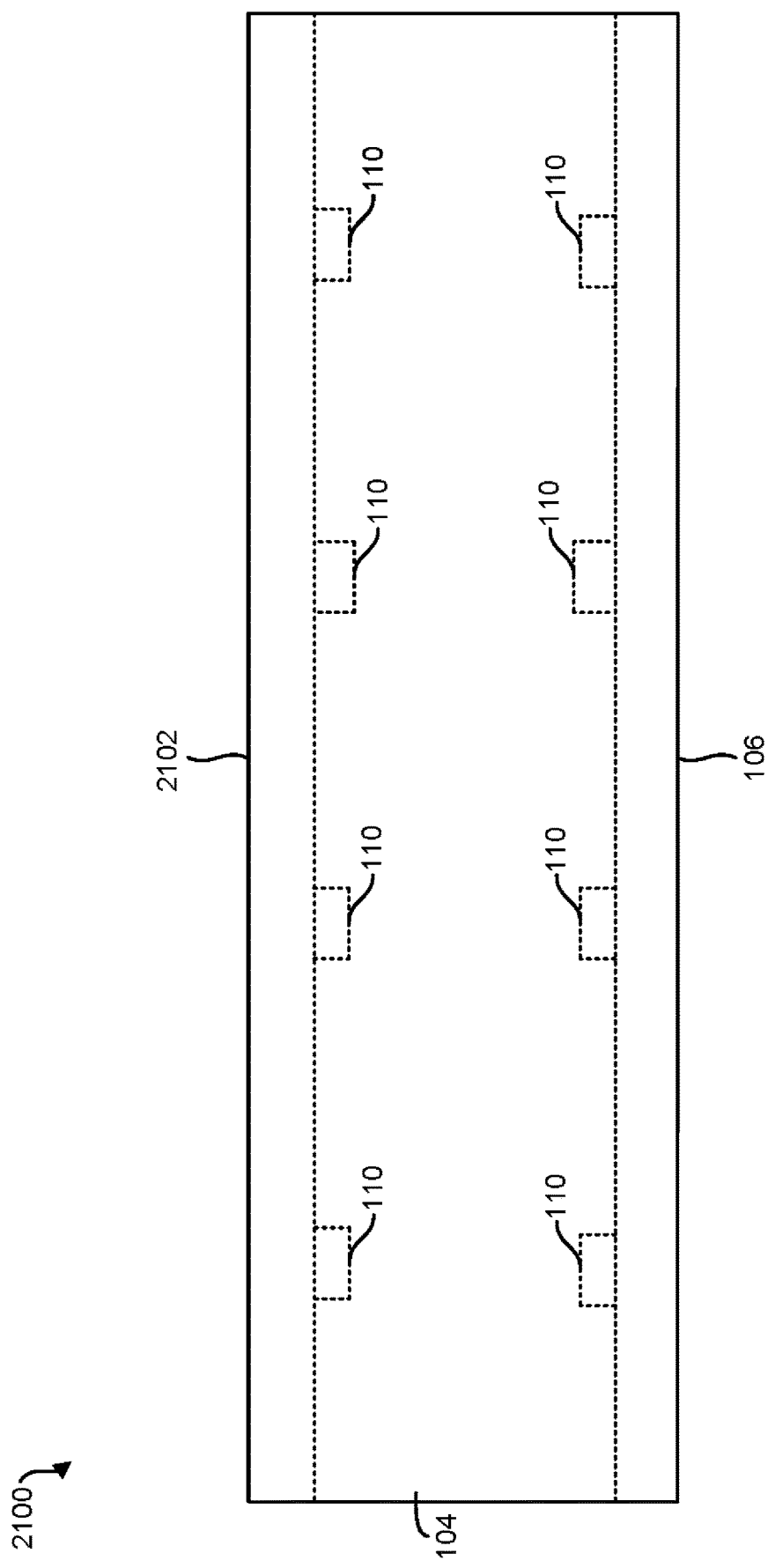
Figure 24:
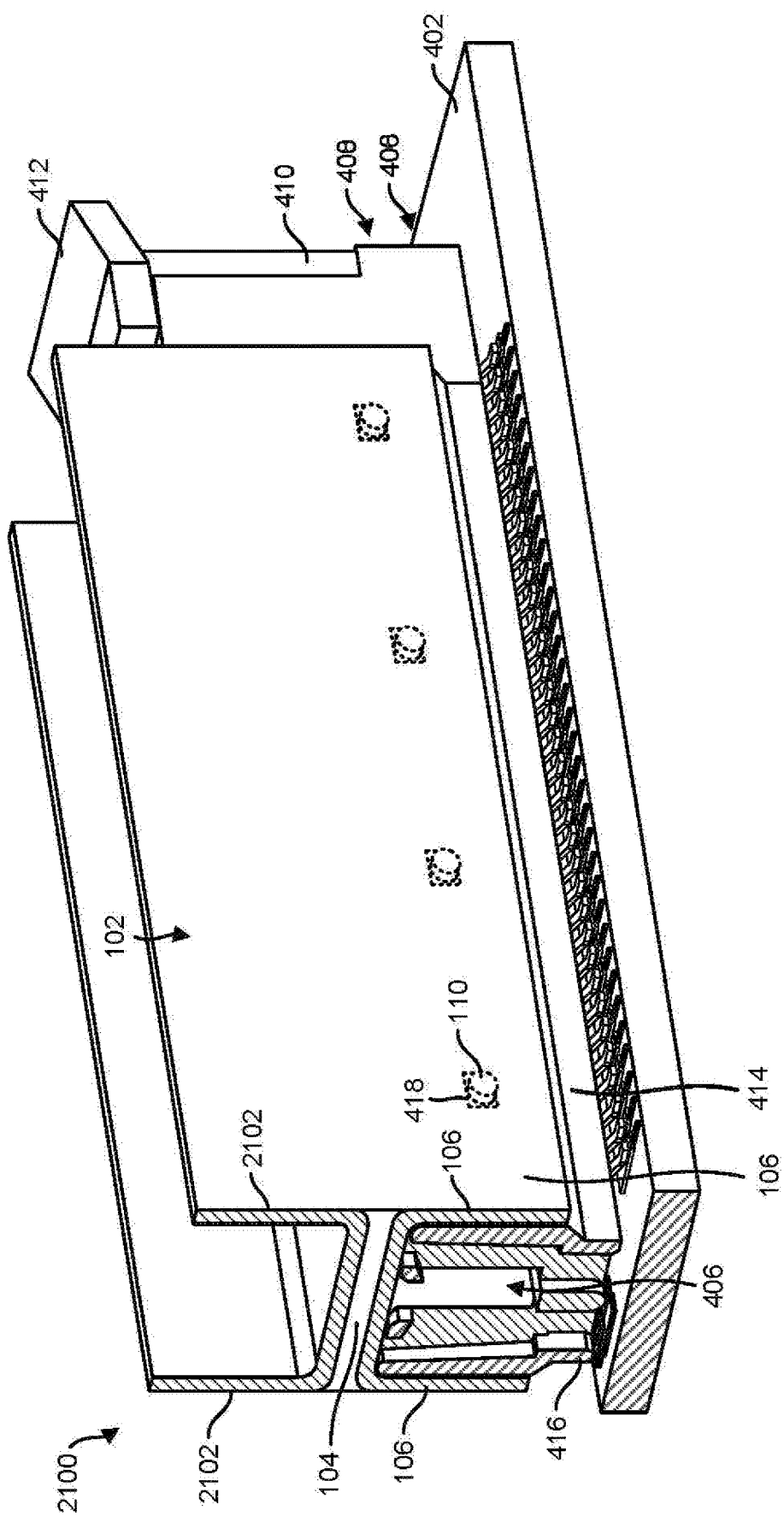
FIG. 24 is a cutaway view of the apparatus of FIGS. 21-23 coupled to a surface mount connector, according to one or more examples of the disclosure.
Figure 25:
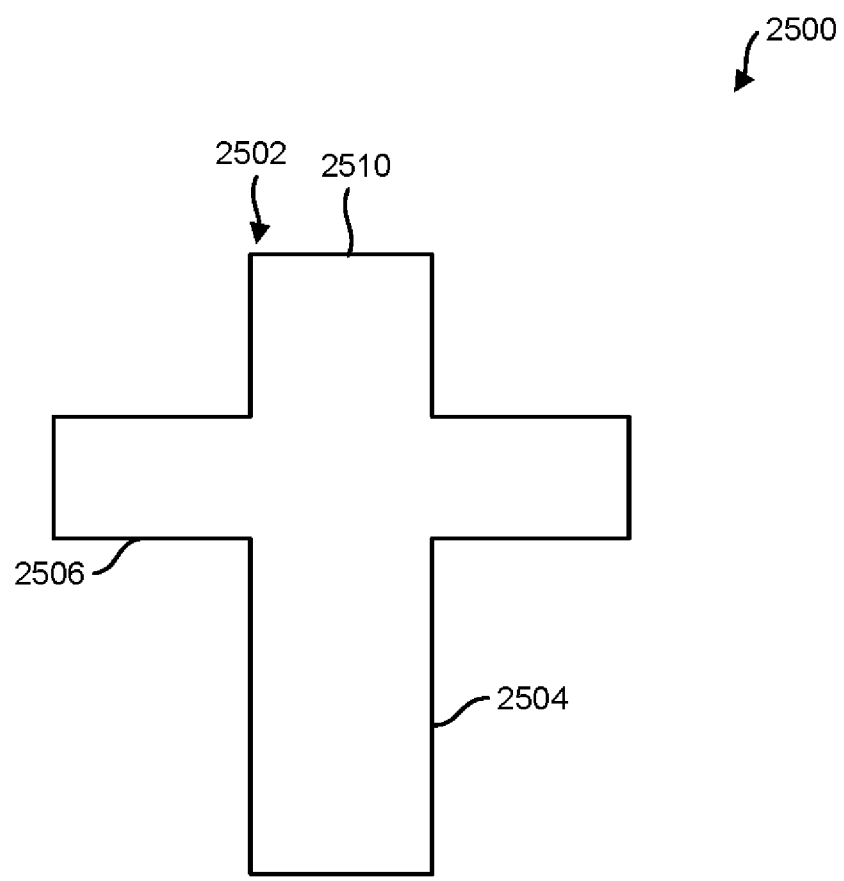
FIGS. 25-27 are respective front, side, and top views of an apparatus, according to one or more examples of the disclosure.
Figure 26:
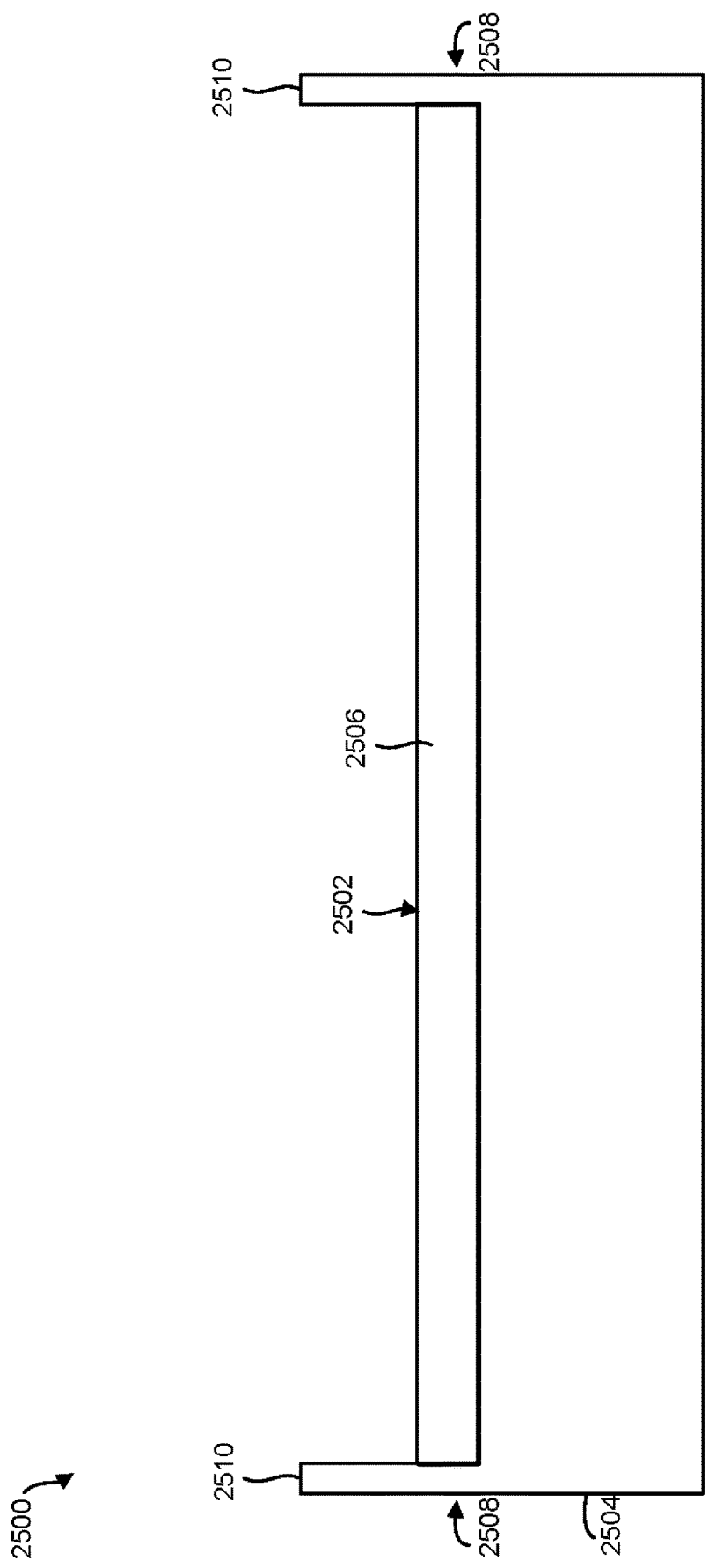
Figure 27:
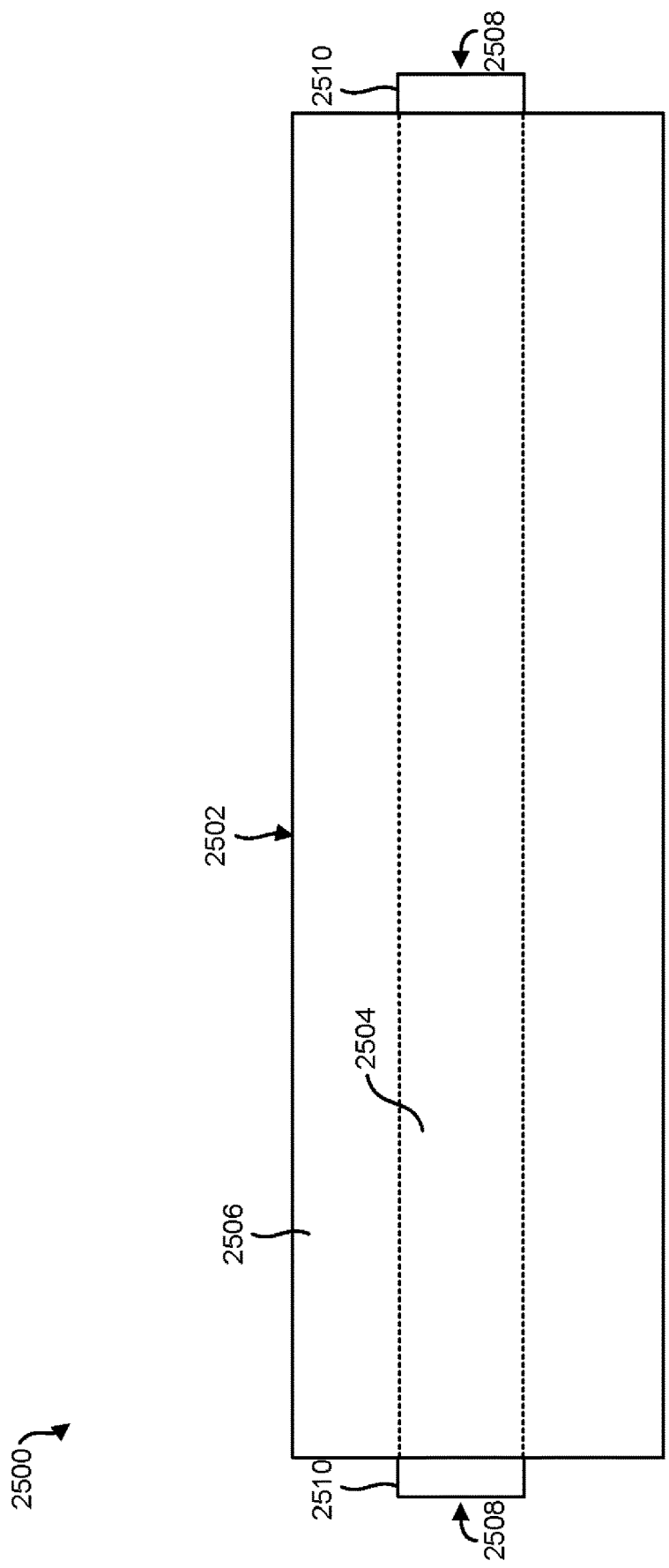
Figure 28:
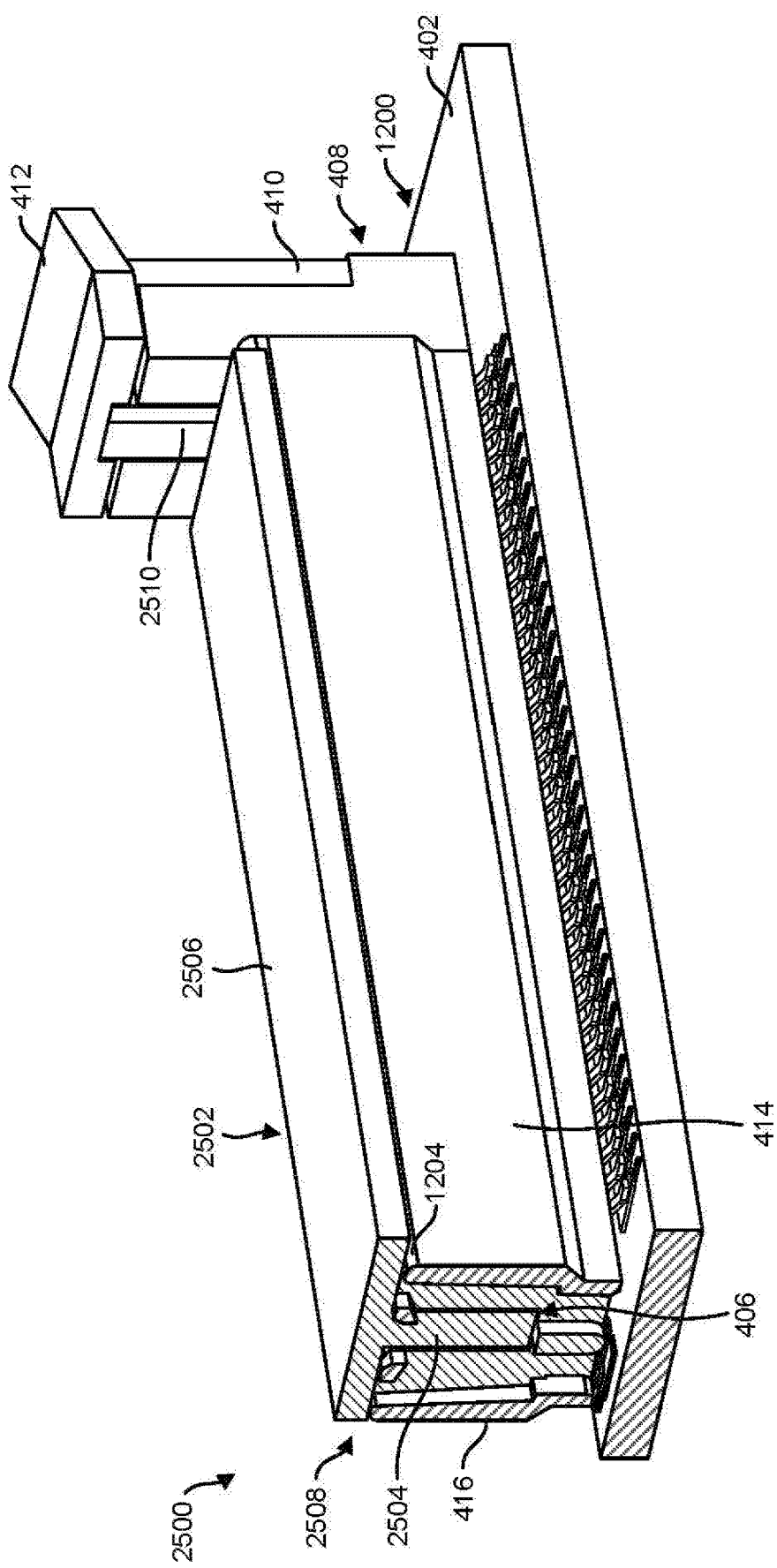
FIG. 28 is a cutaway view of the apparatus of FIGS. 25-27 coupled to a surface mount connector, according to one or more examples of the disclosure.
Figure 29:
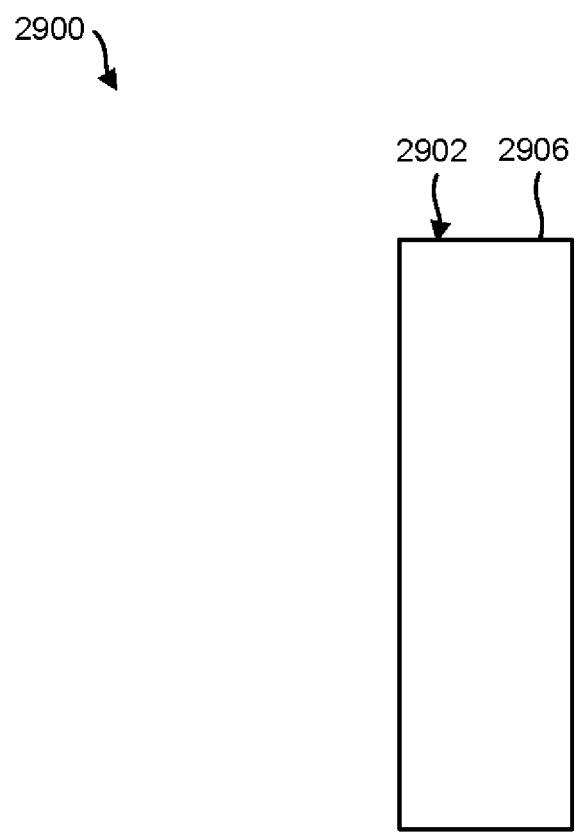
FIGS. 29-31 are respective front, side, and top views of an apparatus, according to one or more examples of the disclosure.
Figure 30:
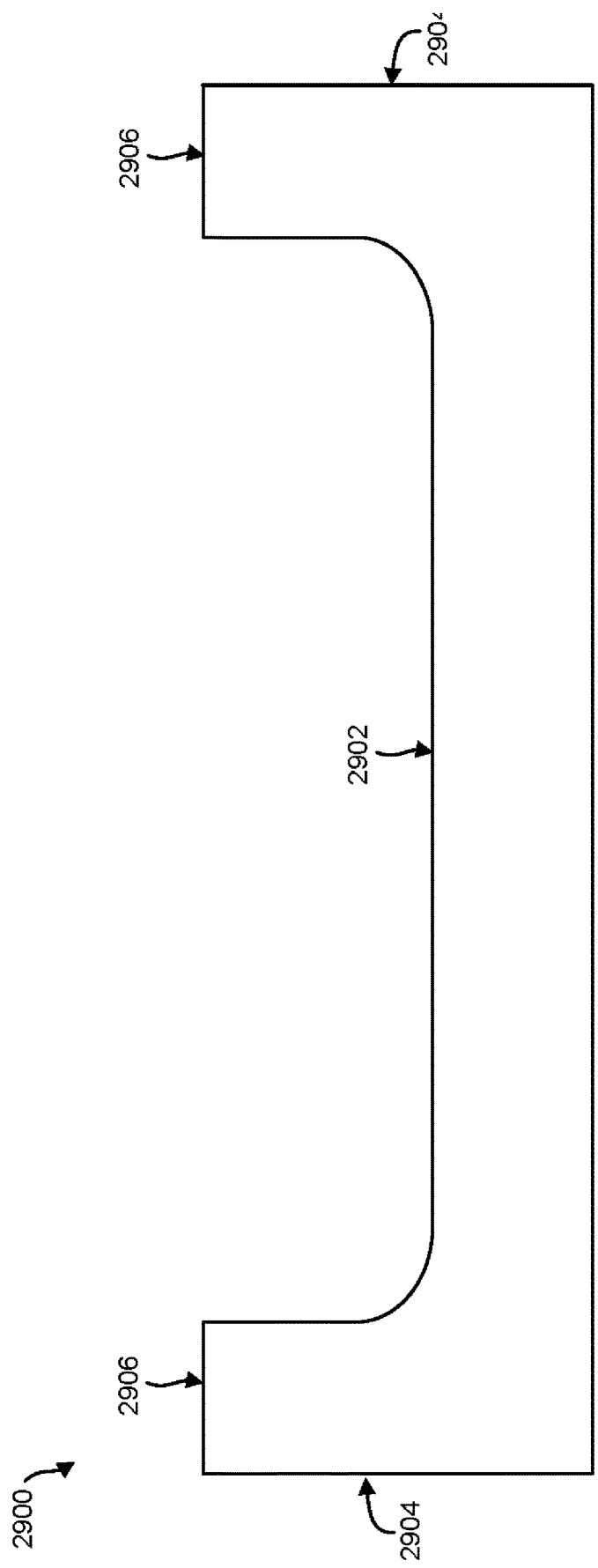
Figure 31:
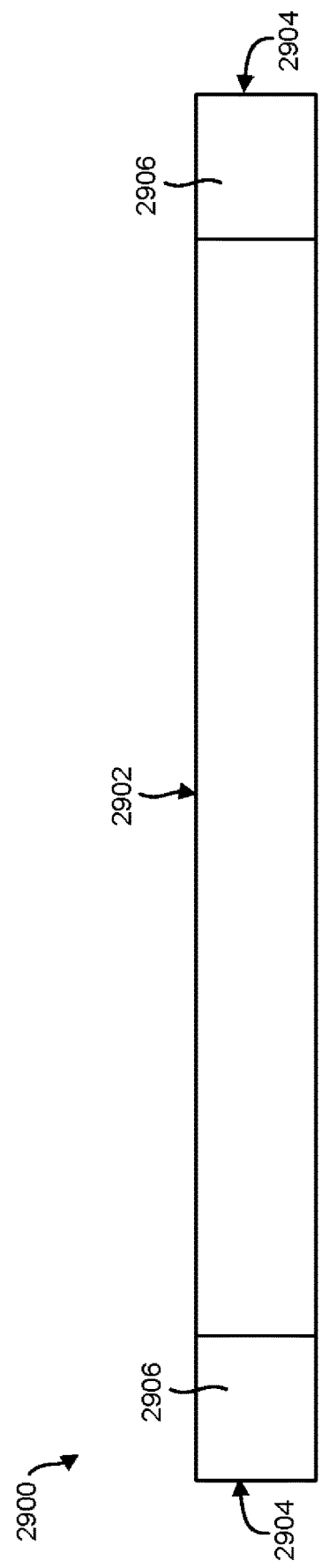

To couple the apparatus 1700 to the surface mount connector as illustrated in FIG. 20, the apparatus 1700 is placed over the surface mount connector 1200 such that each side body portion 106 of the apparatus 1700 is placed into contact with a respective outer wall 414, 416 of the surface mount connector 1200. As the center support 1702 is inserted into the socket 406 of the surface mount connector 1200, each lip 1302 of the apparatus 1700 is guided into engagement with a respective angled in-step 1202, thereby coupling the apparatus 1700 to the surface mount connector 1200.

As coupled, the apparatus 1700 provides structural rigidity to the surface mount connector 1200. The addition of the center support 1702 may provide enhanced structural support relative to the apparatus 1300 of FIGS. 13-16. Accordingly, during the application of heat energy to the surface mount connector 1200 in, for example, a reflow oven, and thereafter as the solder cools, the apparatus 1700 reduces, and in some instances, prevents the end portions 408 of the surface mount connector 1200 from lifting off the PCB 402 or otherwise warping in shape, thereby resulting in the surface mount connector 1200 remaining flat (i.e., without curvature) during the thermal excursion of the soldering process. As a result of such, the solder forms appropriate solder joints and an acceptable connection is made between the leads of the surface mount connector 1200 and the PCB 402. After SMT, the apparatus 1700 may be decoupled from the surface mount connector 1200 and an electronic component (e.g., DIMM—not shown) may be inserted into the socket 406.

Turning now to FIGS. 21-24, respective front, side, and top views of an apparatus 2100 are shown in FIGS. 21-23, and FIG. 24 is a cutaway view of the apparatus 2100 coupled to the surface mount connector 400, according to one or more examples of the disclosure. The apparatus 2100 may be similar in some aspects to the apparatus 100 of FIGS. 1-4, and thus, like numbers will refer to like components, which will not be discussed again in detail for the sake of brevity.

The apparatus 2100 may include two side body portions 2102, each side body portion 2102 extending from the center body portion 104 at a respective lateral end thereof and in an opposing direction from side body portions 106. In one or more examples, the side body portions 2102 may be substantially parallel (within +/−10 degrees) to one another, such that the body 102 is substantially H-shaped. The structure and composition of the body 102 may allow for the side body portions 2102 to serve as an actuating portion of a clamp or clip, in that forcing each side body portion 2102 toward one another permits the pivoting outward of side body portions 106 and the removal of a force to each side body portion 2102 permits the side body portions 106 to return to their resting position (i.e., original state). As such, the side body portions 2102 facilitate the placement and removal of the apparatus 2100 from the surface mount connector 400.

By way of example, to couple apparatus 2100 to surface mount connector 400, the apparatus 2100 is placed over the surface mount connector 400 such that each side body portion 106 of the apparatus 100 is placed into contact with a respective outer wall 414, 416 of the surface mount connector 400. At or before this time, a force may be applied to the side body portions 2102 forcing the side body portions 2102 toward one another, and thereby causing the side body portions 106 to pivot outward away from one another. Each protrusion 110 of the apparatus 2100 may then be guided and inserted into a respective cavity 418 of the connector housing 404, thereby coupling the apparatus 2100 to the surface mount connector 400. The force on the side body portions 2102 may be removed, and the side body portions 106 may pivot back inward to their original position.

As coupled to the surface mount connector 400, the apparatus 2100 provides structural rigidity to the surface mount connector 400. Accordingly, during the application of heat energy to the surface mount connector 400 in, for example, a reflow oven, the apparatus 2100 reduces, and in some instances, prevents the end portions 408 of the surface mount connector 400 from lifting off the PCB 402 or otherwise warping in shape, thereby resulting in the surface mount connector 400 remaining flat (i.e., without curvature) during the thermal excursion of the soldering process. As a result of such, the solder forms appropriate solder joints and an acceptable connection is made between the leads of the surface mount connector 400 and the PCB 402. After SMT, the apparatus 2100 may be decoupled from the surface mount connector 400 and an electronic component (e.g., DIMM—not shown) may be inserted into the socket 406.

To decouple the apparatus 2100 from the surface mount connector 400, a force may be applied to the side body portions 2102 forcing the side body portions 2102 toward one another, and thereby causing the side body portions 106 to pivot outward away from one another. Each protrusion 110 of the apparatus 2100 may be guided out of a respective cavity 418 of the connector housing 404, thereby decoupling the apparatus 2100 from the surface mount connector 400.

Although the side body portions 2102 are illustrated with respect to apparatus 2100, it will be appreciated that the side body portions 2102 may be included in any of apparatus 100, 500, 900, 1300, and 1700 and thus may be utilized with respect to the surface mount connector 1200 in addition to the surface mount connector 400.

Turning now to FIGS. 25-28, respective front, side, and top views of an apparatus 2500 are shown in FIGS. 25-27, and FIG. 28 is a cutaway view of the apparatus 2500 coupled to the surface mount connector 1200, according to one or more examples of the disclosure. The apparatus 2500 may be configured to reduce, and in some instances, prevent deformation (e.g., warpage) of the surface mount connector 1200 subjected to heat energy during SMT.

To that end, the apparatus 2500 may include a T-shaped body 2502 in cross section including a vertically extending portion 2504 and a horizontally extending portion 2506. The T-shaped body 2502 may be sized to extend between towers 410 of the surface mount connector 1200 and may include opposing end portions 2508, where each end portion 2508 includes a tab 2510 extending from the vertically extending portion 2504 and the horizontally extending portion 2506. In one or more examples, each tab 2510 extends from the vertically extending portion 2504, such that the height of the apparatus 2500 at each end portion 2508 mimics the height of a DIMM. Accordingly, as configured, the vertically extending portion 2504 may be inserted into the socket 406 of the surface mount connector 1200 such that the horizontally extending portion 2506 rests on a top surface 1204 of the surface mount connector 1200 and each tab 2510 may engage with a respective latch 412 of the surface mount connector 1200. In some examples, each tab 2510 may define a notch (not shown) configured to further engage with the latch 412.

To couple the apparatus 2500 to the surface mount connector 1200, the vertically extending portion 2504 may be guided into alignment with and inserted into the socket 406 of the surface mount connector 1200 until the horizontally extending portion 2506 contacts the top surface 1204 of the surface mount connector 1200. In addition, each latch 412 may at least partially extend over and engage with a respective tab 2510 at each end portion 2508 of the T-shaped body 2502 to further couple the apparatus 2500 to the surface mount connector 1200.

As coupled to the surface mount connector 1200, the apparatus 2500 provides structural rigidity to the surface mount connector 1200. Accordingly, during the application of heat energy to the surface mount connector 1200 in, for example, a reflow oven, and thereafter as the solder cools, the apparatus 2500 reduces, and in some instances, prevents the end portions 408 of the surface mount connector 1200 from lifting off the PCB 402 or otherwise warping in shape, thereby resulting in the surface mount connector 1200 remaining flat (i.e., without curvature) during the thermal excursion of the soldering process. As a result of such, the solder forms appropriate solder joints and an acceptable connection is made between the leads of the surface mount connector 1200 and the PCB 402. After SMT, the apparatus 2500 may be decoupled from the surface mount connector 1200 and an electronic component (e.g., DIMM—not shown) may be inserted into the socket 406.

Turning now to FIGS. 29-32, respective front, side, and top views of an apparatus 2900 are shown in FIGS. 29-31, and FIG. 32 is a cutaway view of the apparatus 2900 coupled to the surface mount connector 1200, according to one or more examples of the disclosure. The apparatus 2900 may be configured to reduce, and in some instances, prevent deformation (e.g., warpage) of the surface mount connector 1200 subjected to heat energy during SMT.

To that end, the apparatus 2900 may include an elongated body 2902 having a generally rectangular cross section. The elongated body 2902 may be constructed to mimic a DIMM and may be metallic or ceramic in one or more examples. In another example, the elongated body 2902 may be formed from a polymeric material, such as the material used to construct surface mount connector 1200. The elongated body 2902 may extend between the opposing end portions 408 (one shown) of the surface mount connector 1200 and may be sized and configured to be insertable in the socket 406 of the surface mount connector 1200. The elongated body 2902 may further include opposing end portions 2904, each end portion 2904 having an extension 2906 extending from and coplanar with the remainder of the elongated body 2902. As configured, the elongated body 2902 may be inserted into the socket 406 of the surface mount connector 1200 such that each extension 2906 of the elongated body 2902 may be engaged with a respective latch 412 of the surface mount connector 1200. In some examples, each extension 2906 may define a notch (not shown) configured to further engage with the latch 412.

Figure 32:
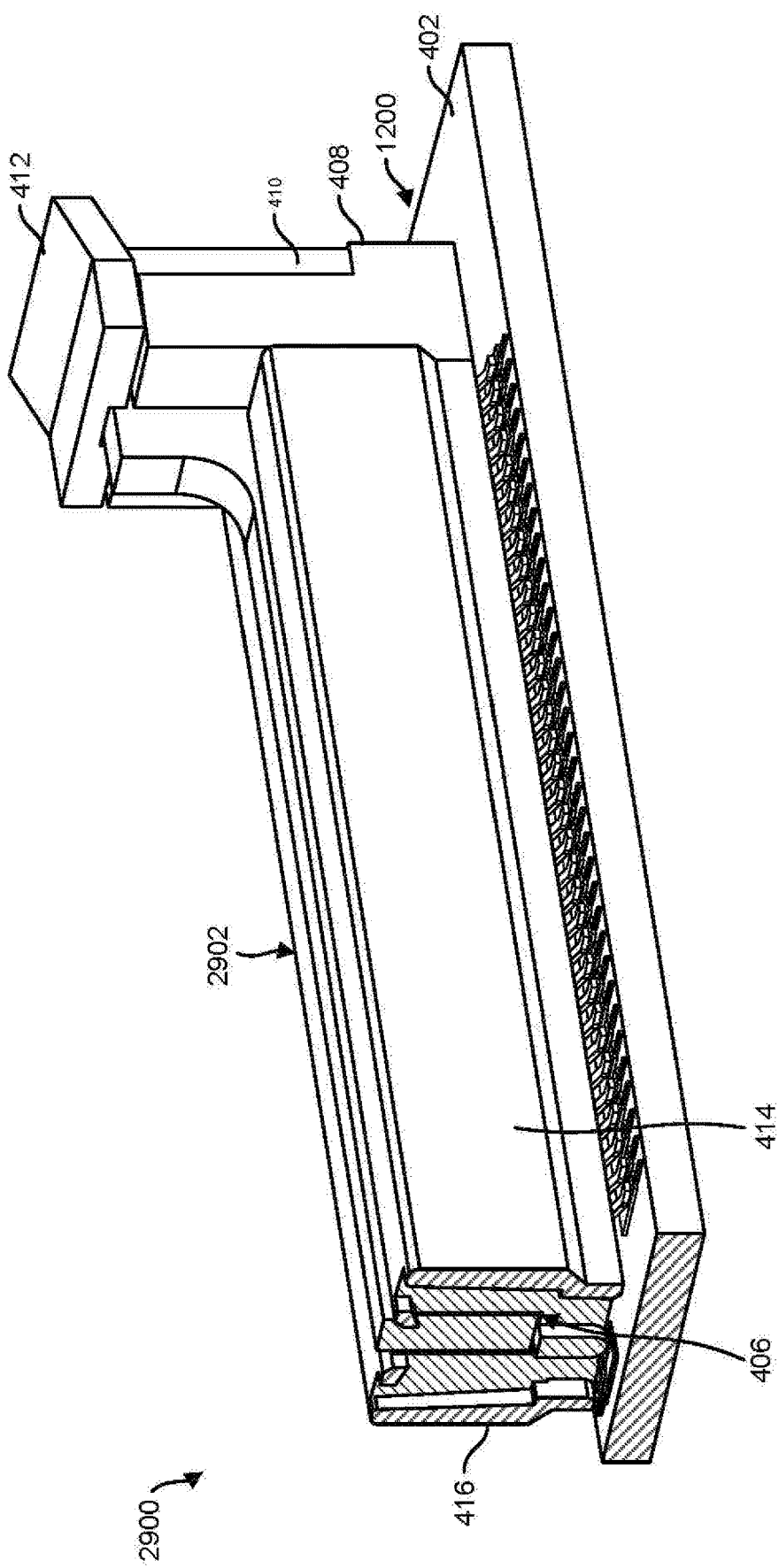
FIG. 32 is a cutaway view of the apparatus of FIGS. 29-31 coupled to a surface mount connector, according to one or more examples of the disclosure.
Figure 33A:
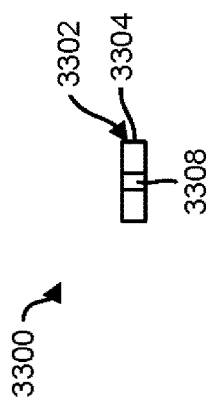
Figure 34A:
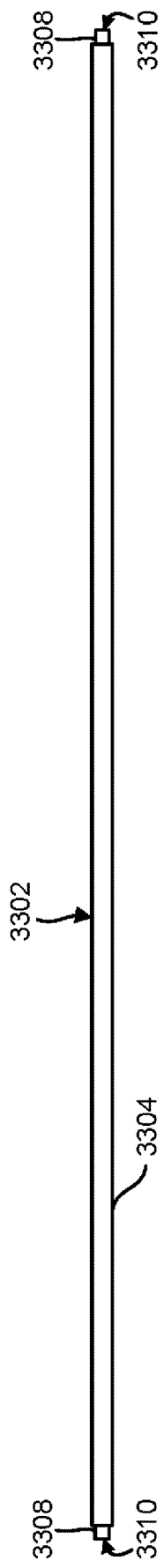
Figure 35A:
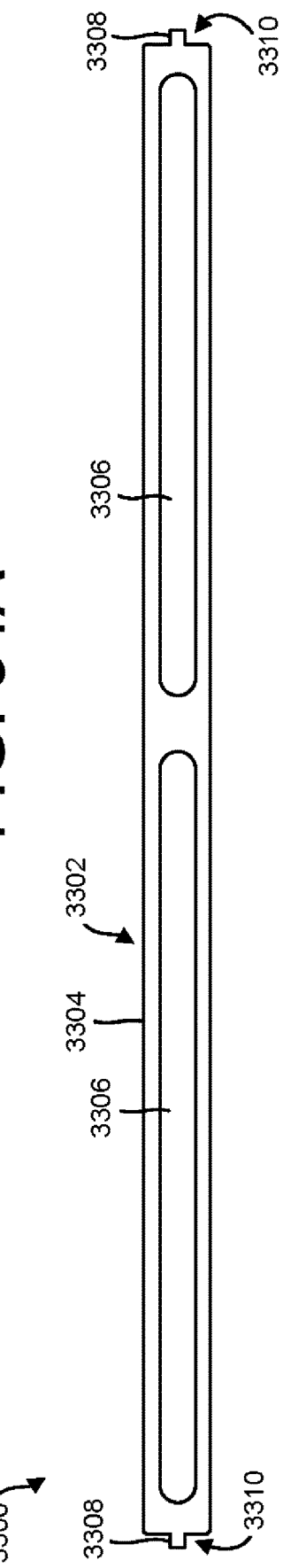
Figure 33B:
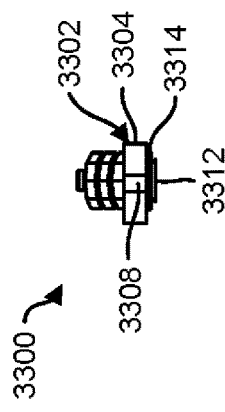
Figure 34B:
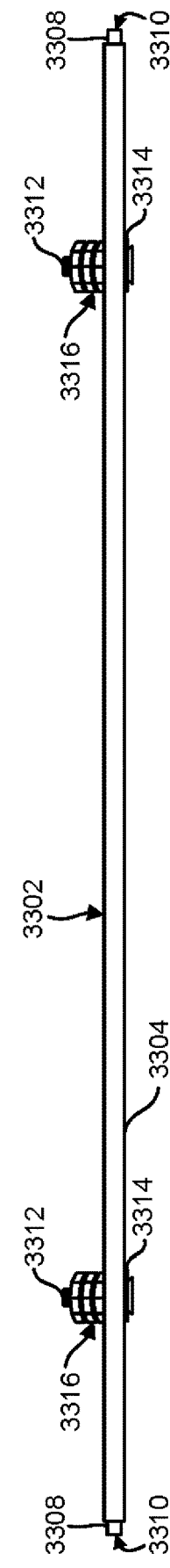
Figure 35B:
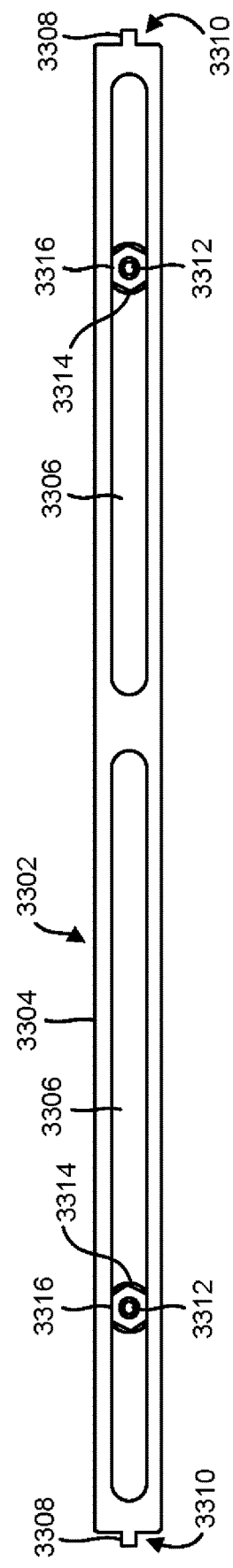

Accordingly, to couple the apparatus 2900 to the surface mount connector 1200 as illustrated in FIG. 32, the elongated body 2902 may be guided into alignment with and inserted into the socket 406 of the surface mount connector 1200. In addition, each latch 412 may at least partially extend over and engage with a respective extension 2906 of the elongated body 2902 to couple the apparatus 2900 to the surface mount connector 1200.

As coupled to the surface mount connector 1200, the apparatus 2900 provides structural rigidity to the surface mount connector 1200. Accordingly, during the application of heat energy to the surface mount connector 1200 in, for example, a reflow oven, and thereafter as the solder cools, the apparatus 2900 reduces, and in some instances, prevents the end portions 408 of the surface mount connector 1200 from lifting off the PCB 402 or otherwise warping in shape, thereby resulting in the surface mount connector 1200 remaining flat (i.e., without curvature) during the thermal excursion of the soldering process. As a result of such, the solder forms appropriate solder joints and an acceptable connection is made between the leads of the surface mount connector 1200 and the PCB 402. After SMT, the apparatus 2900 may be decoupled from the surface mount connector 1200 and an electronic component (e.g., DIMM—not shown) may be inserted into the socket 406.

Turning now to FIGS. 33A-36A, respective front, side, and top views of an apparatus 3300 are shown in FIGS. 33A-35A, and FIG. 36A is a cutaway view of the apparatus 3300 coupled to the surface mount connector 1200, according to one or more examples of the disclosure. The apparatus 3300 may be configured to reduce, and in some instances, prevent deformation (e.g., warpage) of the surface mount connector 1200 subjected to heat energy during SMT.

To that end, the apparatus 3300 may include an elongated body 3302 formed from one or more slabs 3304 (one shown). Each slab 3304 may be planar (i.e., straight) and disposed in a stacked arrangement to form the elongated body 3302. The number of slabs 3304 in the elongated body 3302 may be a function of the desired rigidity and/or weight of the apparatus 3300. The slab(s) 3304 forming the elongated body 3302 function as a distributed weight across the top surface 1204 of the surface connector 1200 to reduce, and is some cases, prevent warpage of the surface mount connector 1200. Each slab 3304 may define a plurality of slots 3306 (two shown). Each slab may further form a tab 3308 at a respective end portion 3310 thereof sized and configured to be inserted in the socket 406 of the respective tower 410. As shown in FIGS. 33B-36B, the apparatus 3300 may further include a plurality of threaded fasteners (e.g., screws) 3312 (two shown), a plurality of washers 3314 (two shown), and a plurality of retention members (e.g., nuts) 3316 (six shown). In one or more implementations, each screw 3312 may be a countersunk flat head screw, and an edge of a bottom slab 3304 of the stacked arrangement defining the perimeter of each slot 3306 may be chamfered to match the countersunk, flat head screw. In such an implementation, each screw 3312 may be recessed into the bottom slab 3304, thereby avoiding contact with the top surface 1204 of the surface mount connector 1200 and providing a more evenly applied force.

Prior to coupling the apparatus 3300 to the surface mount connector 1200, the apparatus 3300 may be assembled by stacking the slabs 3304 (if more than one) one atop the other. In the implementation illustrated in FIGS. 33B-36B, a washer 3314 may be placed over the threaded fastener 3312 and the threads of each threaded fastener 3312 may be inserted through a slot 3306 of the slab(s) 3304. One or more nuts 3316 may then be threaded onto the threaded fastener 3312 and tightened to be flush with the slab 3304 or an adjacent nut 3316. The placement of the weight assembly (threaded fastener 3312, washer 3314, and nuts 3316) along the elongated body 3302 may mimic the weight blocks applied to the surface mount connector 1200 as noted above as a previous solution. Accordingly, the number of nuts 3316 used may be chosen to mirror the weight of the weight blocks applied by the previous solution. Additionally, in other implementations, other components (e.g., bushings) may be utilized to form the weight assemblies without departing from the scope of this disclosure.

Figure 36A:
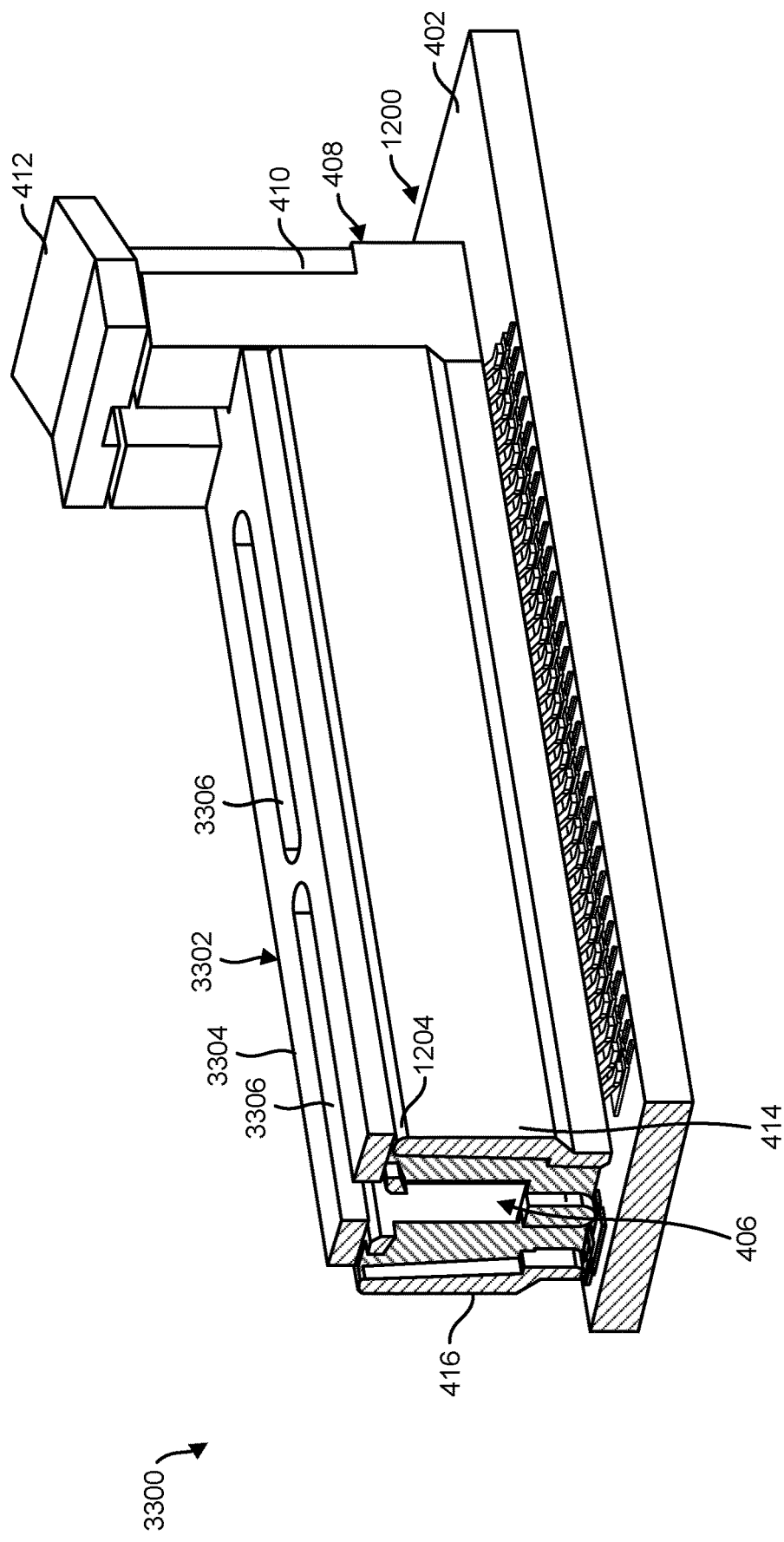
FIG. 36A is a cutaway view of the apparatus of FIGS. 33A-35A coupled to a surface mount connector, according to one or more examples of the disclosure.
Figure 36B:
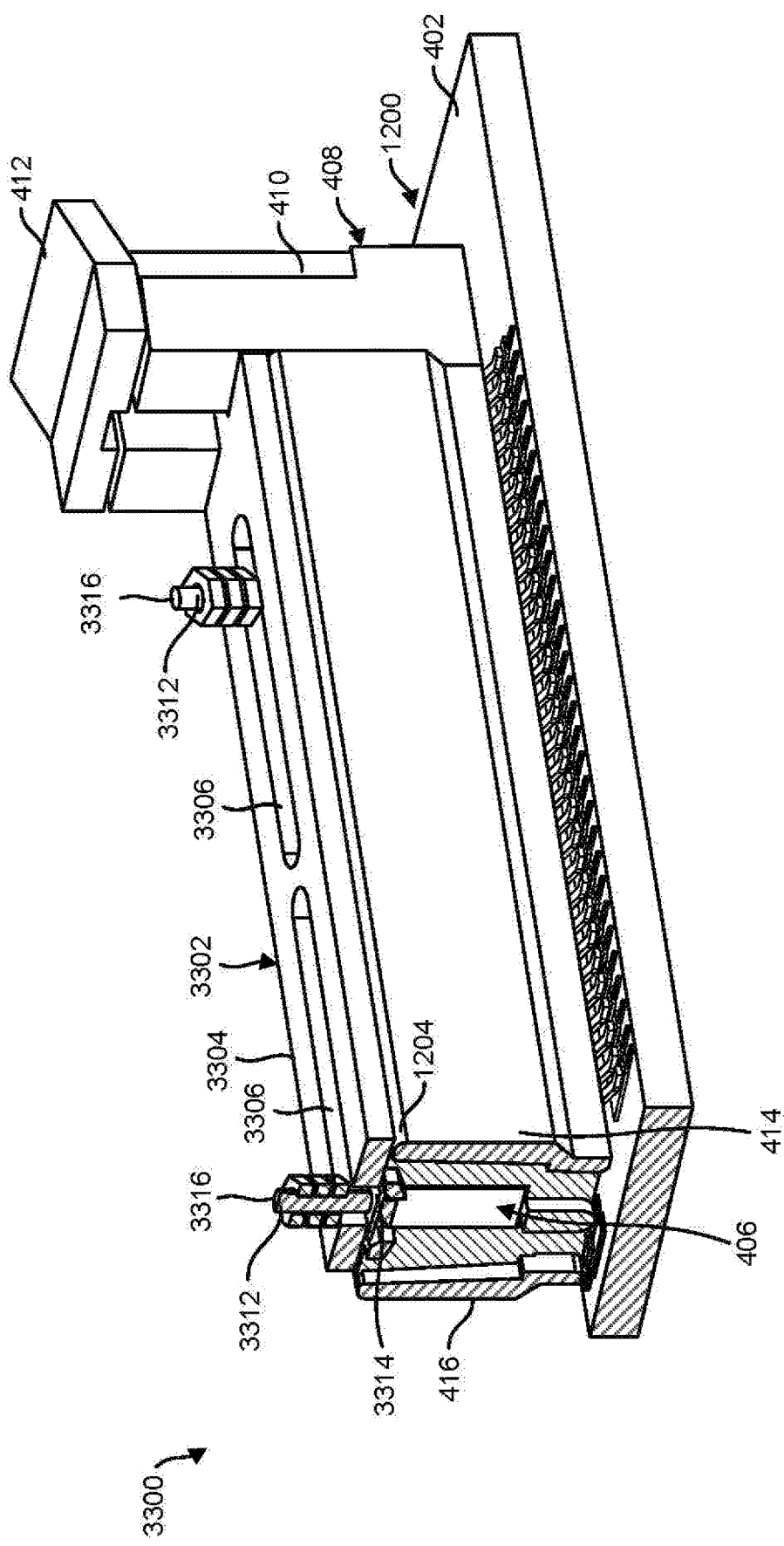
FIG. 36B is a cutaway view of the apparatus of FIGS. 33B-35B coupled to a surface mount connector, according to one or more examples of the disclosure.
Figure 37:
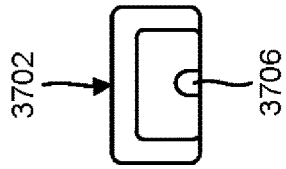
FIGS. 37-39 are respective front, side, and top views of an apparatus, according to one or more examples of the disclosure.
Figure 38:
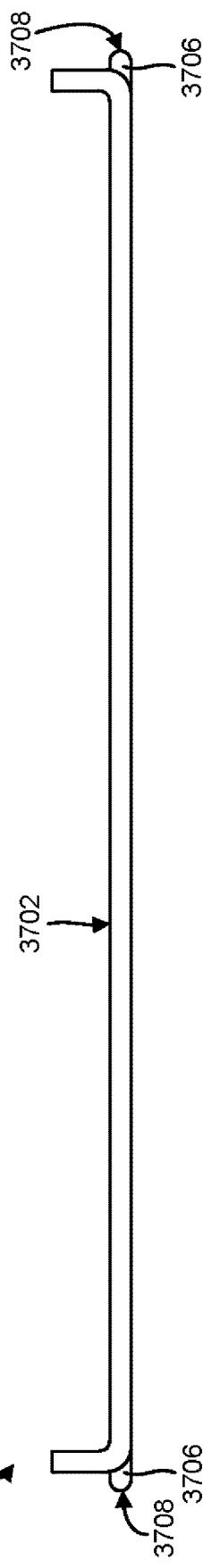
Figure 39:
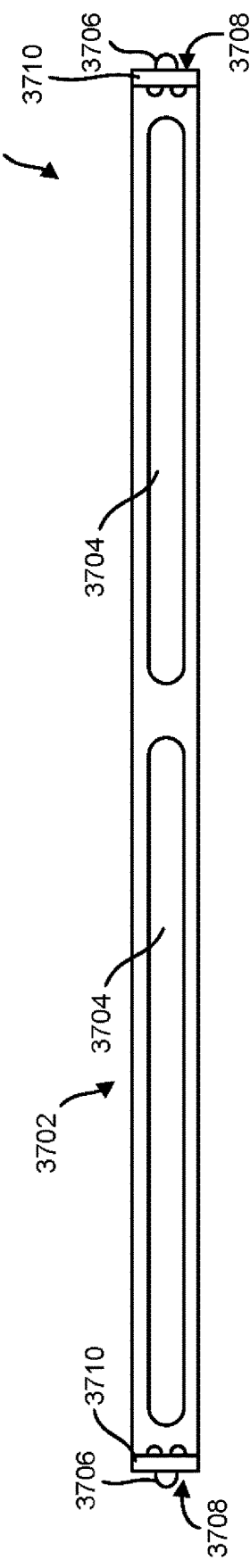

To couple the apparatus 3300 to the surface mount connector 1200 as illustrated in FIG. 36A or FIG. 36B, the tabs 3308 of the elongated body 3302 may be guided into alignment with and inserted into the respective portion of the socket 406 defined by the towers 410 of the surface mount connector 1200. The slab(s) 3304 may rest on the top surface 1204 of the surface mount connector 1200. As coupled to the surface mount connector 1200, the apparatus 3300 provides structural rigidity to the surface mount connector 1200. Accordingly, during the application of heat energy to the surface mount connector 1200 in, for example, a reflow oven, and thereafter as the solder cools, the apparatus 3300 reduces, and in some instances, prevents the end portions 408 of the surface mount connector 1200 from lifting off the PCB 402 or otherwise warping in shape, thereby resulting in the surface mount connector 1200 remaining flat (i.e., without curvature) during the thermal excursion of the soldering process. As a result of such, the solder forms appropriate solder joints and an acceptable connection is made between the leads of the surface mount connector 1200 and the PCB 402. After SMT, the apparatus 3300 may be decoupled from the surface mount connector 1200 and an electronic component (e.g., DIMM—not shown) may be inserted into the socket 406.

Turning now to FIGS. 37-40, respective front, side, and top views of an apparatus 3700 are shown in FIGS. 37-39, and FIG. 40 is a cutaway view of the apparatus 3700 coupled to the surface mount connector 1200, according to one or more examples of the disclosure. The apparatus 3700 may be configured to reduce, and in some instances, prevent deformation (e.g., warpage) of the surface mount connector 1200 subjected to heat energy during SMT.

To that end, the apparatus 3700 may include an elongated body 3702 defining a plurality of slots 3704 (two shown). The elongated body 3702 may further form a tab 3706 at a respective end portion 3708 thereof sized and configured to be inserted in the socket 406 of the respective tower 410. The elongated body 3702 may further include a U-shaped extension 3710 at a respective end portion 3708 thereof sized and configured to abut the tower 410. In addition, in one or more implementations, the apparatus 3700 may include a plurality of weight assemblies (threaded fastener 3312, washer 3314, and nuts 3316) coupled to the elongated body 3702 in a similar fashion to the apparatus 3300.

Figure 40:
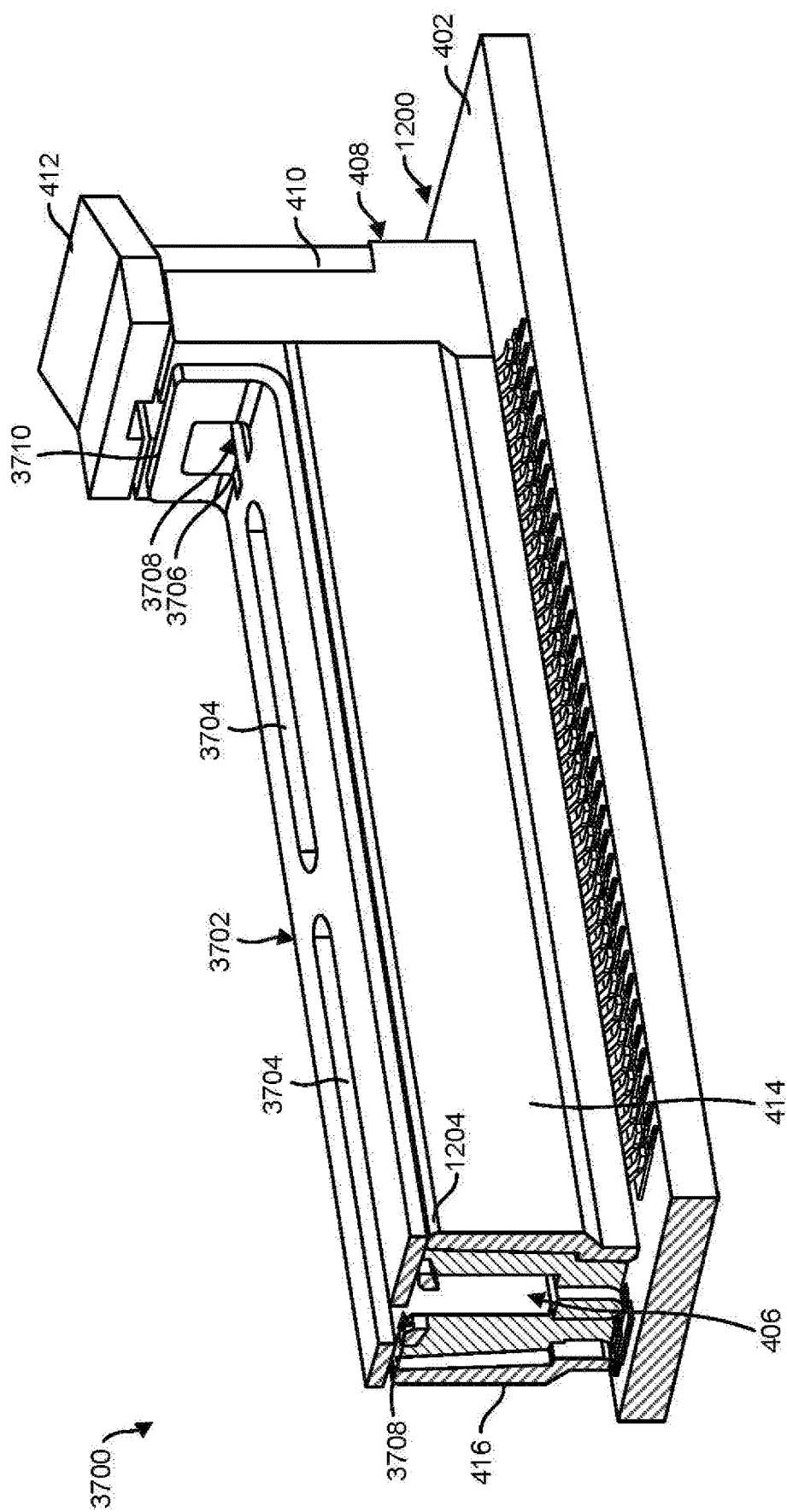
FIG. 40 is a cutaway view of the apparatus of FIGS. 37-39 coupled to a surface mount connector, according to one or more examples of the disclosure.
Figure 44:
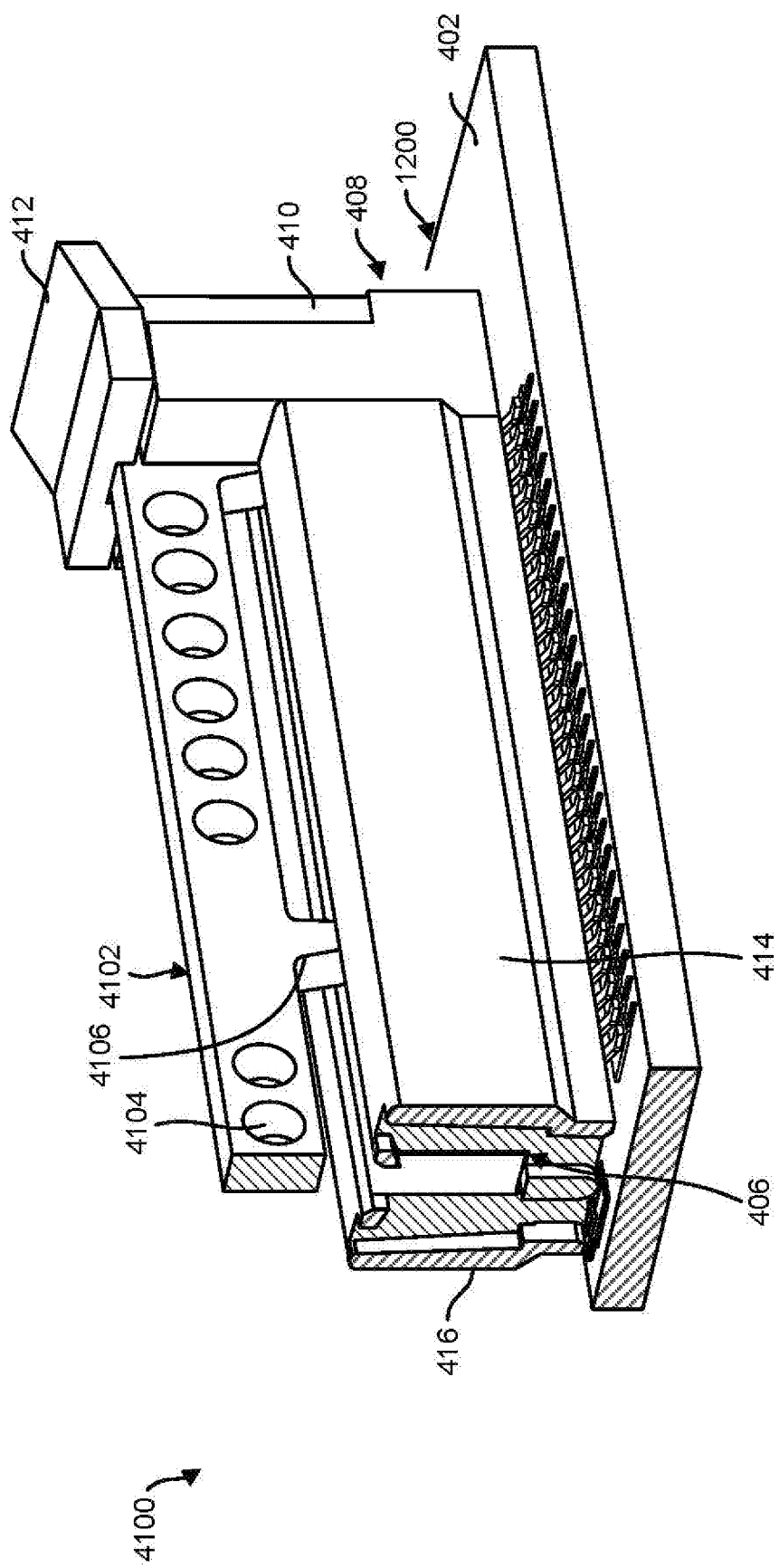
FIG. 44 is a cutaway view of the apparatus of FIGS. 41-43 coupled to a surface mount connector, according to one or more examples of the disclosure.

To couple the apparatus 3700 to the surface mount connector 1200 as illustrated in FIG. 40, the tabs 3706 of the elongated body 3702 may be guided into alignment with and inserted into the respective portion of the socket 406 defined by the towers 410 of the surface mount connector 1200. With the tabs 3706 in the sockets 406 of the tower 410, the U-shaped extensions 3710 may abut a respective tower 410 and the elongated body 3702 may be disposed on the top surface 1204 of the surface mount connector 1200. As coupled to the surface mount connector 1200, the apparatus 3700 provides structural rigidity to the surface mount connector 1200. Accordingly, during the application of heat energy to the surface mount connector 1200 in, for example, a reflow oven, and thereafter as the solder cools, the apparatus 3700 reduces, and in some instances, prevents the end portions 408 of the surface mount connector 1200 from lifting off the PCB 402 or otherwise warping in shape, thereby resulting in the surface mount connector 1200 remaining flat (i.e., without curvature) during the thermal excursion of the soldering process. As a result of such, the solder forms appropriate solder joints and an acceptable connection is made between the leads of the surface mount connector 1200 and the PCB 402. After SMT, the apparatus 3700 may be decoupled from the surface mount connector 1200 and an electronic component (e.g., DIMM—not shown) may be inserted into the socket 406.

Turning now to FIGS. 41-44, respective front, side, and top views of an apparatus 4100 are shown in FIGS. 41-43, and FIG. 44 is a cutaway view of the apparatus 4100 coupled to the surface mount connector 1200, according to one or more examples of the disclosure. The apparatus 4100 may be configured to reduce, and in some instances, prevent deformation (e.g., warpage) of the surface mount connector 1200 subjected to heat energy during SMT.

To that end, the apparatus 4100 may include an elongated body 4102 defining a plurality of holes 4104 (only one indicated) along the length thereof. The elongated body 4102 may further include a plurality of legs 4106 (three shown). The elongated body 4102 may include a leg 4102 at each end portion 4108 of the elongated body 4102 and an additional leg 4106 at a center portion of the elongated body 4102. Accordingly, in one or more examples, the leg 4106 at the center portion may be equidistant from the legs 4102 at each end portion 4108. The legs 4102 and 4106 may extend from the remainder of the elongated body 4102 such that the height of the apparatus 4100 at each end portion 4108 mimics the height of a DIMM.

To couple the apparatus 4100 to the surface mount connector 1200, the legs 4106 of the elongated body 4102 may be guided into alignment with and inserted into the socket 406 of the surface mount connector 1200. In addition, each latch 412 may at least partially extend over and engage with a top surface 4112 of the elongated body 4102 at each end portion 4108 of the elongated body 4102 to further couple the apparatus 4100 to the surface mount connector 1200.

As coupled to the surface mount connector 1200, the apparatus 4100 provides structural rigidity to the surface mount connector 1200. Accordingly, during the application of heat energy to the surface mount connector 1200 in, for example, a reflow oven, the apparatus 4100 reduces, and in some instances, prevents the end portions 408 of the surface mount connector 1200 from lifting off the PCB 402 or otherwise warping in shape, thereby resulting in the surface mount connector 1200 remaining flat (i.e., without curvature) during the thermal excursion of the soldering process. As a result of such, the solder forms appropriate solder joints and an acceptable connection is made between the leads of the surface mount connector 1200 and the PCB 402. After SMT, the apparatus 4100 may be decoupled from the surface mount connector 1200 and an electronic component (e.g., DIMM—not shown) may be inserted into the socket 406.

Although each of the apparatus disclosed above are illustrated as coupling to a "vertical" upright surface mount connector (i.e., surface mount connectors 400 or 1200), the disclosure is not limited thereto, and in other examples, each of the apparatus of this disclosure may be coupled to a "right angle" socket, whose electronic component contacts are orthogonal to the those of an upright surface mount connector.

As appreciated from the foregoing disclosure, each apparatus disclosed herein may be configured to couple to the surface mount connector 400 or 1200 prior to a pick and place operation or, in other examples, after the surface mount connector 400 or 1200 is set into a solder paste disposed on a PCB during SMT. However, in some examples, any apparatus of the present disclosure may be molded as a part of the connector housing and removed after solder processing.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. An apparatus to reduce or prevent deformation of a surface mount connector during soldering of the surface mount connector to a substrate in a reflow oven, the surface mount connector including a connector housing having a top surface, a first housing end portion having defined therein a first portion of a socket, and a second housing end portion having defined therein a second portion of a socket, the apparatus comprising:
  an elongated body having a planar surface to couple with and contact the top surface of the surface mount connector along an entire length of the planar surface, wherein the elongated body includes:
    a first body end portion forming a first tab insertable into the first portion of the socket; and
    a second body end portion forming a second tab insertable into the second portion of the socket; wherein the entire length of the planar surface extends from a beginning of the first body end portion to a beginning of the second body end portion.

2. The apparatus of claim 1, wherein the elongated body is formed from a plurality of slabs in a stacked arrangement.

3. The apparatus of claim 2, wherein the plurality of slabs in a stacked arrangement are configured to be disposed on the top surface of the connector housing to provide a floating weight.

4. The apparatus of claim 1, wherein the first tab and the second tab are each coplanar with the elongated body.

5. The apparatus of claim 2, wherein each slab of the the plurality of slabs includes a plurality of slots.

6. The apparatus of claim 5, wherein a quantity of slabs included in the plurality of slabs is a function of a rigidity to reduce or prevent deformation of the surface mount connector during the soldering.

7. The apparatus of claim 5, further comprising a weight assembly inserted through a slot of the plurality of slots.

8. The apparatus of claim 7, wherein the weight assembly includes a threaded fastener inserted through the slot and at least one nut threaded on the threaded fastener.

9. The apparatus of claim 5, comprising a plurality of weight assemblies inserted through the plurality of slots.

10. The apparatus of claim 1, wherein a remaining portion of the socket, between the first housing end portion and the second housing end portion, is defined by the connector housing and the socket is for receiving an electronic component after the soldering.

11. The apparatus of claim 10, wherein the electronic component is a memory module.

12. The apparatus of claim 1, wherein the surface mount connector is a Surface Mount Technology (SMT) Double Data Rate (DDR) connector.

13. The apparatus of claim 1, wherein the first tab and the second tab are sized for insertion into the first housing end portion and the second housing end portion, respectively.

14. The apparatus of claim 1, wherein the first tab and the second tab have a width that is less than a width of the elongated body.

15. A method for reducing or preventing deformation of a surface mount connector during soldering of the surface mount connector to a substrate in a reflow oven, the surface mount connector including a connector housing having a top surface, a first housing end portion having defined therein a first portion of a socket, and a second housing end portion having defined therein a second portion of a socket, the method comprising:
  providing an apparatus that includes an elongated body having a planar surface to couple with and contact the top surface of the surface mount connector along an entire length of the planar surface, wherein the elongated body includes:
    a first body end portion forming a first tab insertable into the first portion of the socket, and
    a second body end portion forming a second tab insertable into the second portion of the socket, wherein the entire length of the planar surface extends from a beginning of the first body end portion to a beginning of the second body end portion;
  prior to the soldering:
    distributing a weight of the apparatus across a top surface of the surface mount connector by disposing the elongated body on a top surface of the surface mount connector, wherein a planar surface of the elongated body contacts the top surface of the surface mount connector along an entire length of the planar surface;
    inserting the first tab into the first portion of the socket; and
    inserting the second tab into the second portion of the socket.

16. The method of claim 14, further comprising:
  inserting a portion of a first weight assembly and a portion of a second weight assembly through respective slots in the elongated body; and
  fastening the first weight assembly and the second weight assembly to the elongated body.

17. The method of claim 15, wherein said providing comprises forming the elongated body by disposing a plurality of slabs in a stacked arrangement.

18. The method of claim 17, wherein a quantity of slabs included in the plurality of slabs is a function of a desired rigidity or a desired weight of the elongated body.

19. The method of claim 15, further comprising after the soldering:
  decoupling the apparatus from the surface mount connector; and
  inserting an electronic component into the socket.

* * * * *